US012593464B2

(12) United States Patent
Lin et al.

(10) Patent No.: US 12,593,464 B2
(45) Date of Patent: Mar. 31, 2026

(54) DIELECTRIC LAYER FOR NANOSHEET PROTECTION AND METHOD OF FORMING THE SAME

(71) Applicant: Taiwan Semiconductor Manufacturing Co., Ltd., Hsinchu (TW)

(72) Inventors: Cheng-I Lin, Hsinchu (TW); Shu-Han Chen, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 506 days.

(21) Appl. No.: 18/154,975

(22) Filed: Jan. 16, 2023

(65) Prior Publication Data

US 2024/0170563 A1 May 23, 2024

Related U.S. Application Data

(60) Provisional application No. 63/384,639, filed on Nov. 22, 2022.

(51) Int. Cl.
*H01L 29/775* (2006.01)
*H01L 29/06* (2006.01)
(Continued)

(52) U.S. Cl.
CPC ......... *H10D 30/43* (2025.01); *H10D 30/6735* (2025.01); *H10D 62/121* (2025.01); *H10D 64/017* (2025.01); *H10D 64/258* (2025.01)

(58) Field of Classification Search
CPC .. H10D 30/43; H10D 30/6735; H10D 62/121; H10D 64/017; H10D 64/258;
(Continued)

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |

(Continued)

FOREIGN PATENT DOCUMENTS

| | | | |
|---|---|---|---|
| KR | 20210053169 A | 5/2021 | |
| KR | 20210097598 A | 8/2021 | |

(Continued)

*Primary Examiner* — Tong-Ho Kim
(74) *Attorney, Agent, or Firm* — Slater Matsil, LLP

(57) ABSTRACT

A device includes a gate stack having a top portion, and a stacked structure underlying the top portion of the gate stack. The stacked structure includes a plurality of semiconductor nanostructures, with upper nanostructures in the plurality of semiconductor nanostructures overlapping respective lower nanostructures. The stacked structure further includes a plurality of gate structures, each including a lower portion of the gate stack. Each of the plurality of gate structures is between two of the plurality of semiconductor nanostructures. A dielectric layer extends on a top surface and a sidewall of the stacked structure. The dielectric layer includes a lower sub layer comprising a first dielectric material, and an upper sub layer over the lower sub layer and formed of a second dielectric material different from the first dielectric material. A gate spacer is on the dielectric layer. A source/drain region is aside of the gate stack.

20 Claims, 25 Drawing Sheets

(51) Int. Cl.

| | |
|---|---|
| *H01L 29/417* | (2006.01) |
| *H01L 29/423* | (2006.01) |
| *H01L 29/66* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 64/23* | (2025.01) |

(58) Field of Classification Search

CPC ............. H10D 30/6757; H10D 30/014; H10D 62/151; H10D 30/0321; B82Y 10/00

USPC ........................................................ 257/401

See application file for complete search history.

(56) References Cited

U.S. PATENT DOCUMENTS

| | | | |
|---|---|---|---|
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 11,430,865 | B2 | 8/2022 | Chen et al. |
| 11,437,491 | B2 | 9/2022 | Lin et al. |
| 2017/0005195 | A1 | 1/2017 | Ching |
| 2017/0141112 | A1 | 5/2017 | Ching |
| 2017/0154973 | A1 | 6/2017 | Ching |
| 2018/0254329 | A1 | 9/2018 | Guillorn et al. |
| 2019/0058052 | A1 | 2/2019 | Frougier |
| 2019/0067452 | A1* | 2/2019 | Cheng ................. H10D 62/116 |
| 2020/0043802 | A1 | 2/2020 | Cheng |
| 2020/0058801 | A1 | 2/2020 | Cheng |
| 2021/0083074 | A1 | 3/2021 | Yang et al. |
| 2021/0126106 | A1 | 4/2021 | Wang et al. |
| 2021/0134983 | A1* | 5/2021 | Lin ........................ H10D 30/62 |
| 2021/0249517 | A1 | 8/2021 | Cheng et al. |
| 2021/0313449 | A1 | 10/2021 | Lin et al. |
| 2022/0044937 | A1 | 2/2022 | Lee et al. |
| 2022/0293769 | A1 | 9/2022 | Pan et al. |

FOREIGN PATENT DOCUMENTS

| | | |
|---|---|---|
| KR | 20220017813 A | 2/2022 |
| TW | 202117819 A | 5/2021 |
| TW | 202145503 A | 12/2021 |
| TW | 202236510 A | 9/2022 |

* cited by examiner

DIELECTRIC LAYER FOR NANOSHEET PROTECTION AND METHOD OF FORMING THE SAME

PRIORITY CLAIM AND CROSS-REFERENCE

This application claims the benefit of the following provisionally filed U.S. Patent application: Application No. 63/384,639, filed on Nov. 22, 2022, and entitled "Combination of Mono-layer/Bi-layer/Multi-layer Alternative Dielectric and Selective ALD Deposition Technique for Nanosheet Loss and Damage Protection," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
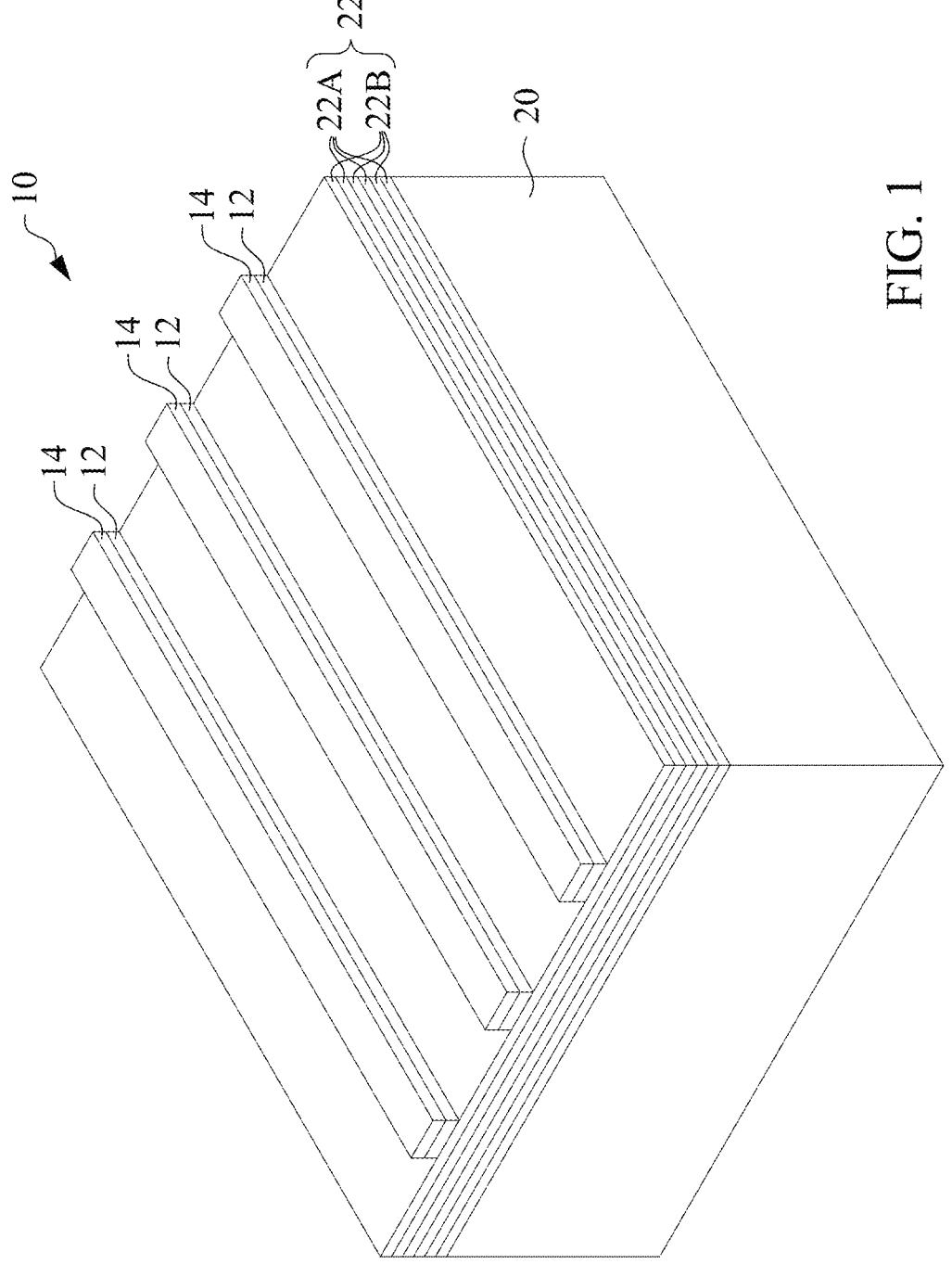
FIGS. 1-3, 4A, 4B, 5-7, 8A, 8B, 8C, 8D, 8E, 9A, 9B, 10A, 10B, 10C, 11A, 11B, 11C, 12A, 12B, 13A, 13B, 13C, 13D, 13E, 14A, 14B, 15A, 15B, 15C, and 15D illustrate the perspective views, cross-sectional views, and top views of intermediate stages in the formation of a Gate All-Around (GAA) transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Gate-All-Around (GAA) transistor with an improved dummy gate dielectric and the method of forming the same are provided. In accordance with some embodiments, the formation of the GAA transistor includes depositing a composite dummy gate dielectric, which includes two or more layers formed of different dielectric materials, so that the damage to underlying silicon nanostructures is reduced. The dummy gate dielectric may be a non-conformal layer, which has a top portion having a thickness greater than the thicknesses of sidewall portions. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 5-7, 8A, 8B, 8C, 8D, 8E, 9A, 9B, 10A, 10B, 10C, 11A, 11B, 11C, 12A, 12B, 13A, 13B, 13C, 13D, 13E, 14A, 14B, 15A, 15B, 15C, and 15D illustrate the perspective views, cross-sectional views, and top views of f intermediate stages in the formation of a GAA transistor in accordance with some embodiments. The corresponding processes are also reflected schematically in the process flow shown in FIG. 16.

Referring to FIG. 1, a perspective view of wafer 10 is shown, which includes substrate 20. A multilayer structure comprising multilayer stack 22 is formed on substrate 20. In accordance with some embodiments, substrate 20 is or comprises a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of epitaxy processes for depositing alternating materials. The respective process is illustrated as process 202 in the process flow 200 shown in FIG. 16. In accordance with some embodiments, multilayer stack 22 comprises first layers 22A formed of a first semiconductor material and second layers 22B formed of a second semiconductor material different from the first semiconductor material. Due to the epitaxy, the first layers 22A and the second layers 22B have the same lattice orientations as substrate 20.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, pad oxide layer 12 and hard mask layer 14 are formed over multilayer stack 22. Pad oxide layer 12 may comprise silicon oxide, silicon carbide, or the like, while hard mask layer 14 may comprise silicon nitride, and other materials may be used. Pad oxide layer 12 and hard mask layer 14 are patterned to form a a plurality of elongated strips, which are also referred to as pad oxides and hard masks.

Figure 2:
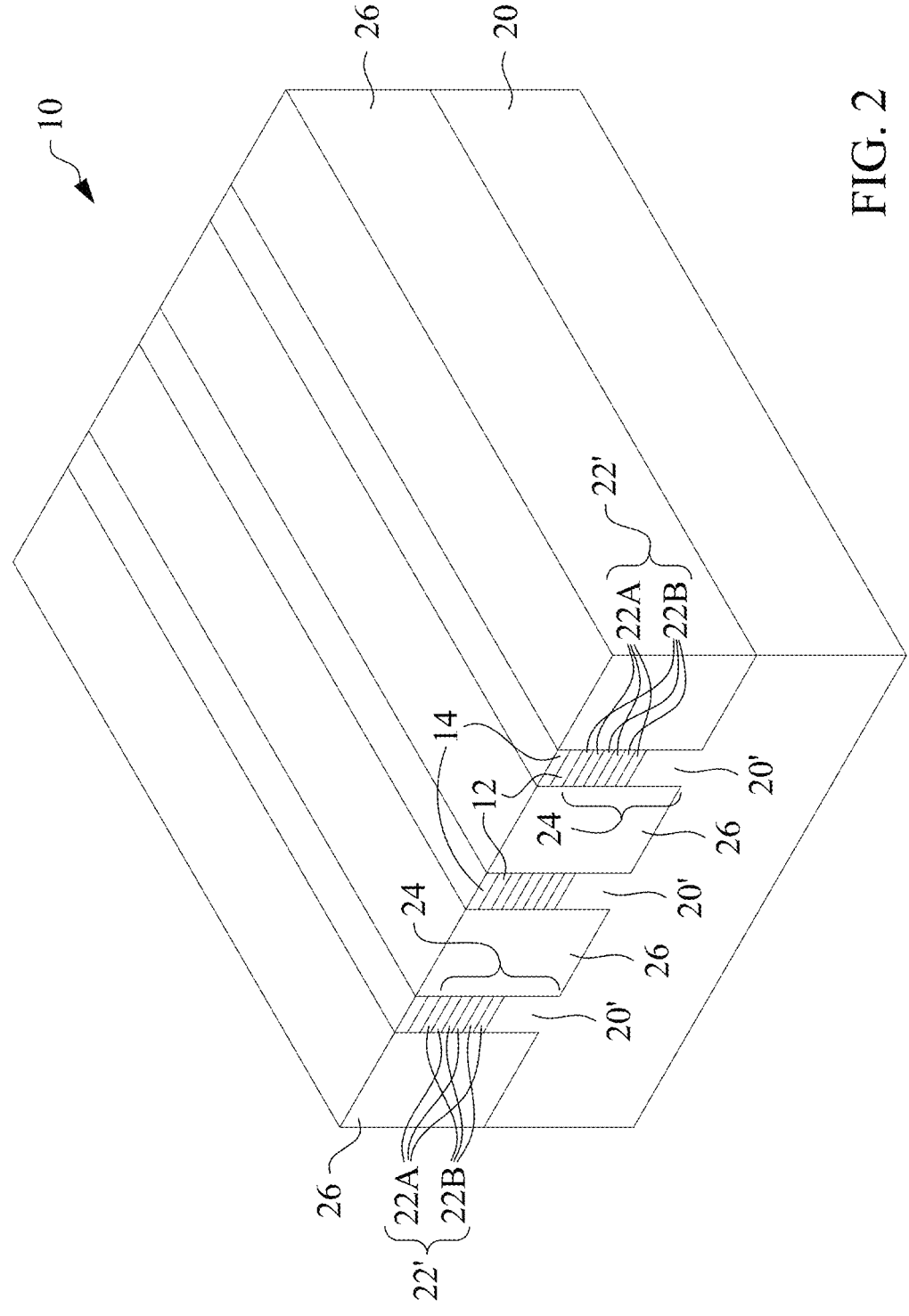

Referring to FIG. 2, multilayer stack 22 and a portion of the underlying substrate 20 are patterned in an etching process(es), so that trenches (filled with isolation regions 26) are formed. The trenches extend into substrate 20. The remaining portions of multilayer stacks are referred to as multilayer stacks 22' hereinafter. The respective process is illustrated as process 204 in the process flow 200 shown in FIG. 16. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Next, isolation regions 26 are formed, which may also be referred to as Shallow Trench Isolation (STI) regions throughout the description. The respective process is illustrated as process 206 in the process flow 200 shown in FIG. 16. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, for example, with the top surface of hard mask layer 14, and the remaining portions of the dielectric material are STI regions 26.

Figure 3:
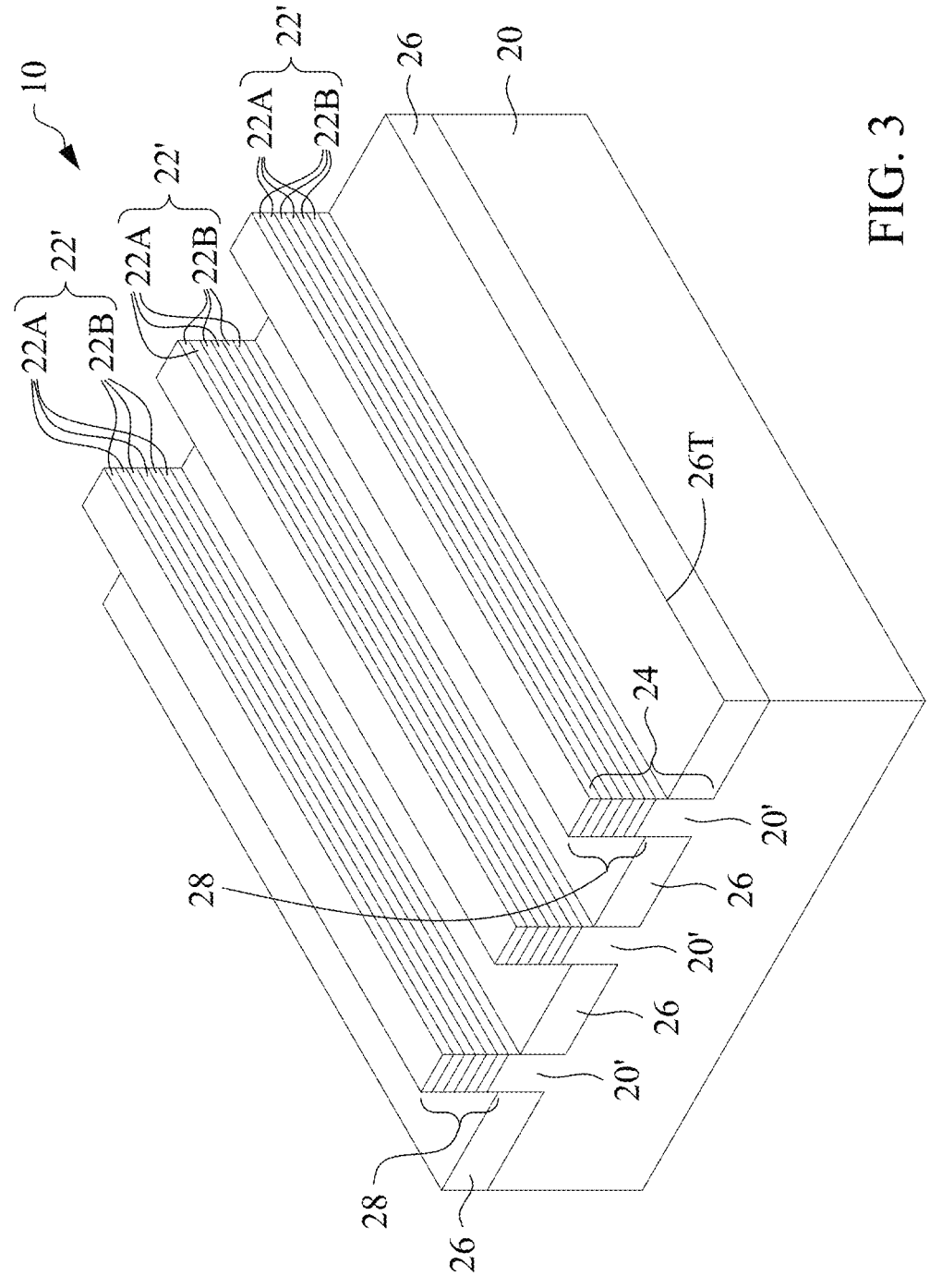

Referring to FIG. 3, STI regions 26 are recessed, so that the top portions of semiconductor strips 24 protrude higher than the top surfaces 26T of the remaining portions of STI regions 26 to form protruding fins (structures) 28 (also referred to as nanosheets). The respective process is illustrated as process 208 in the process flow 200 shown in FIG. 16. Protruding fins 28 include multilayer stacks 22' and some top portions of substrate strips 20'. The recessing of STI regions 26 may be performed through a dry etching process, wherein NF$_3$ and NH$_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example. Pad oxide layers 12 and hard masks 14 are removed.

Figure 4A:
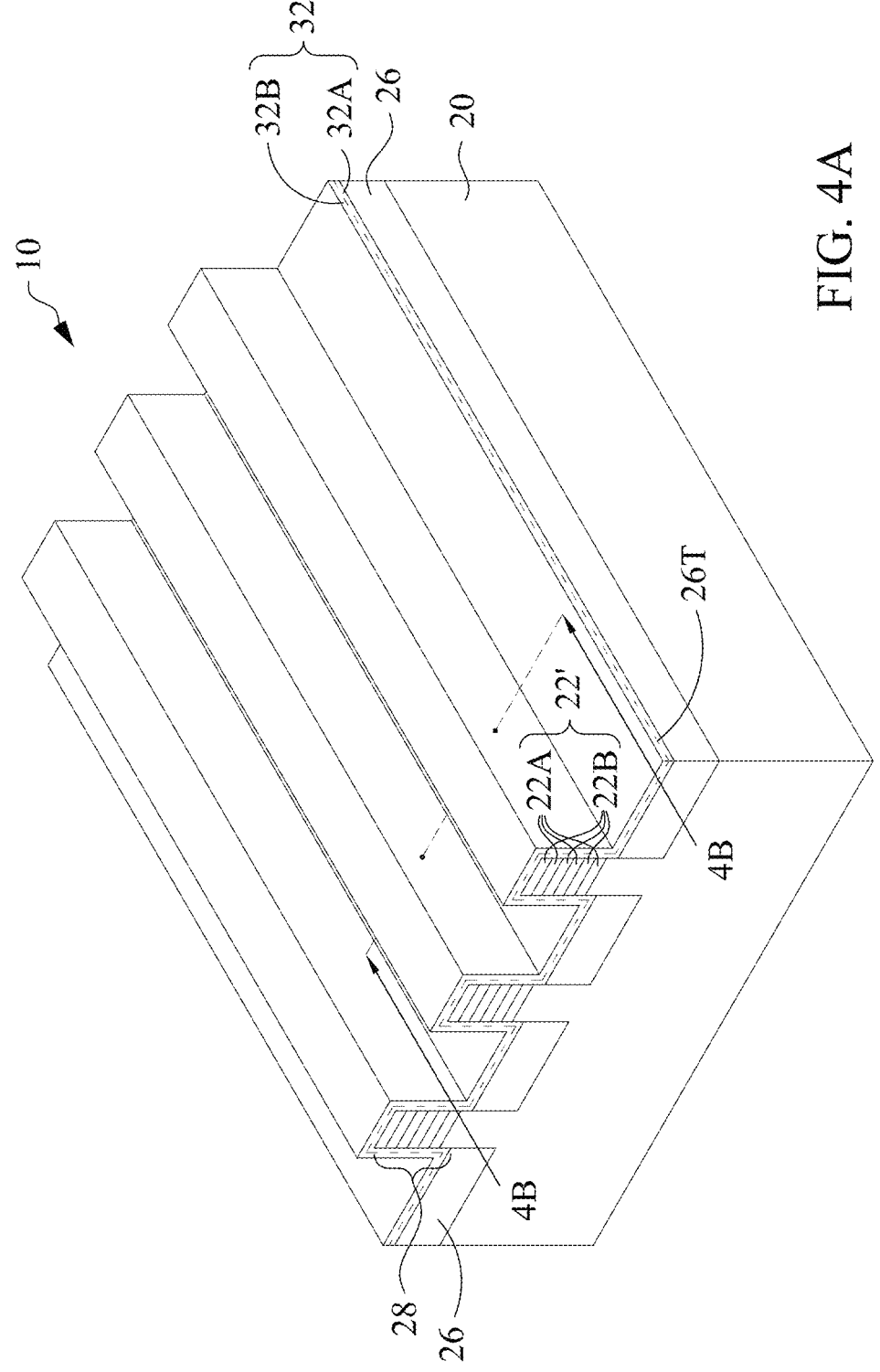
Figure 4B:
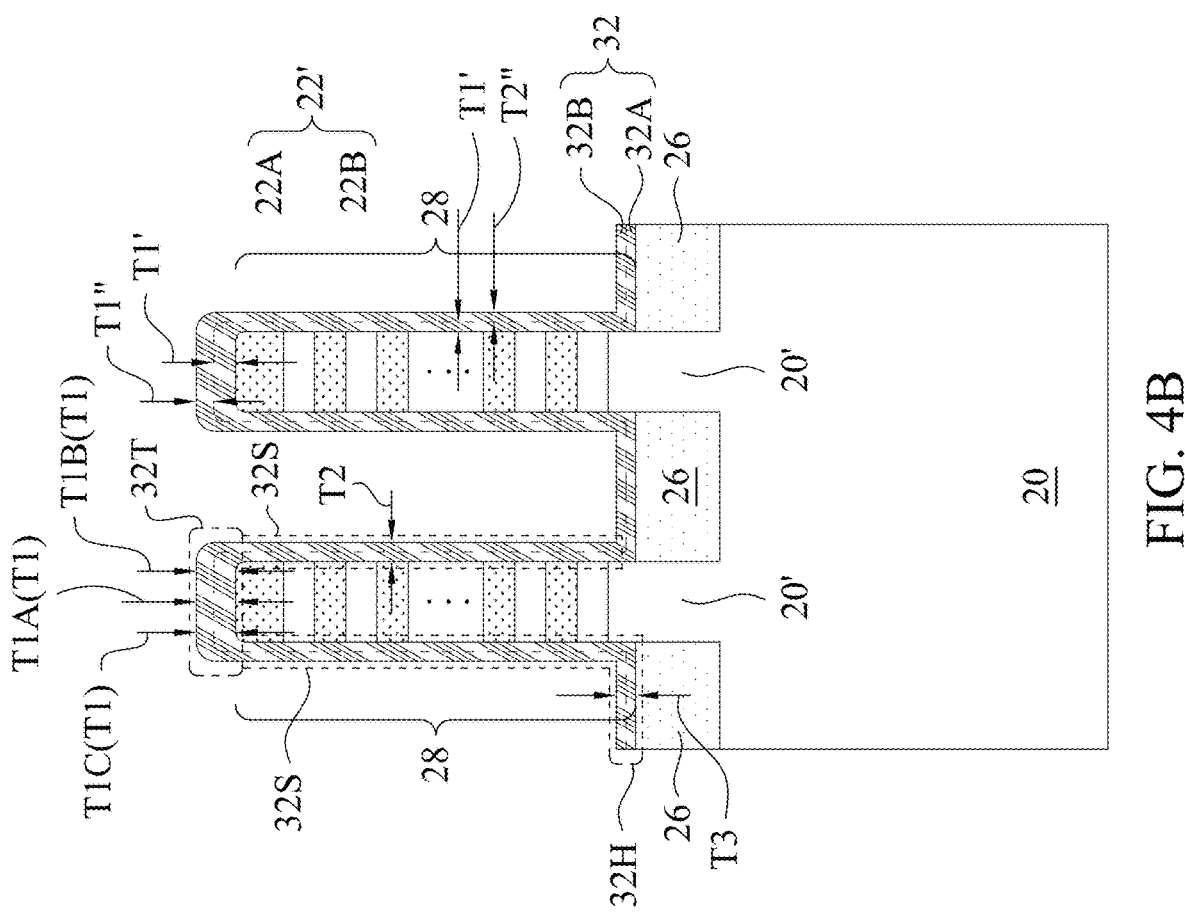
Figure 16:
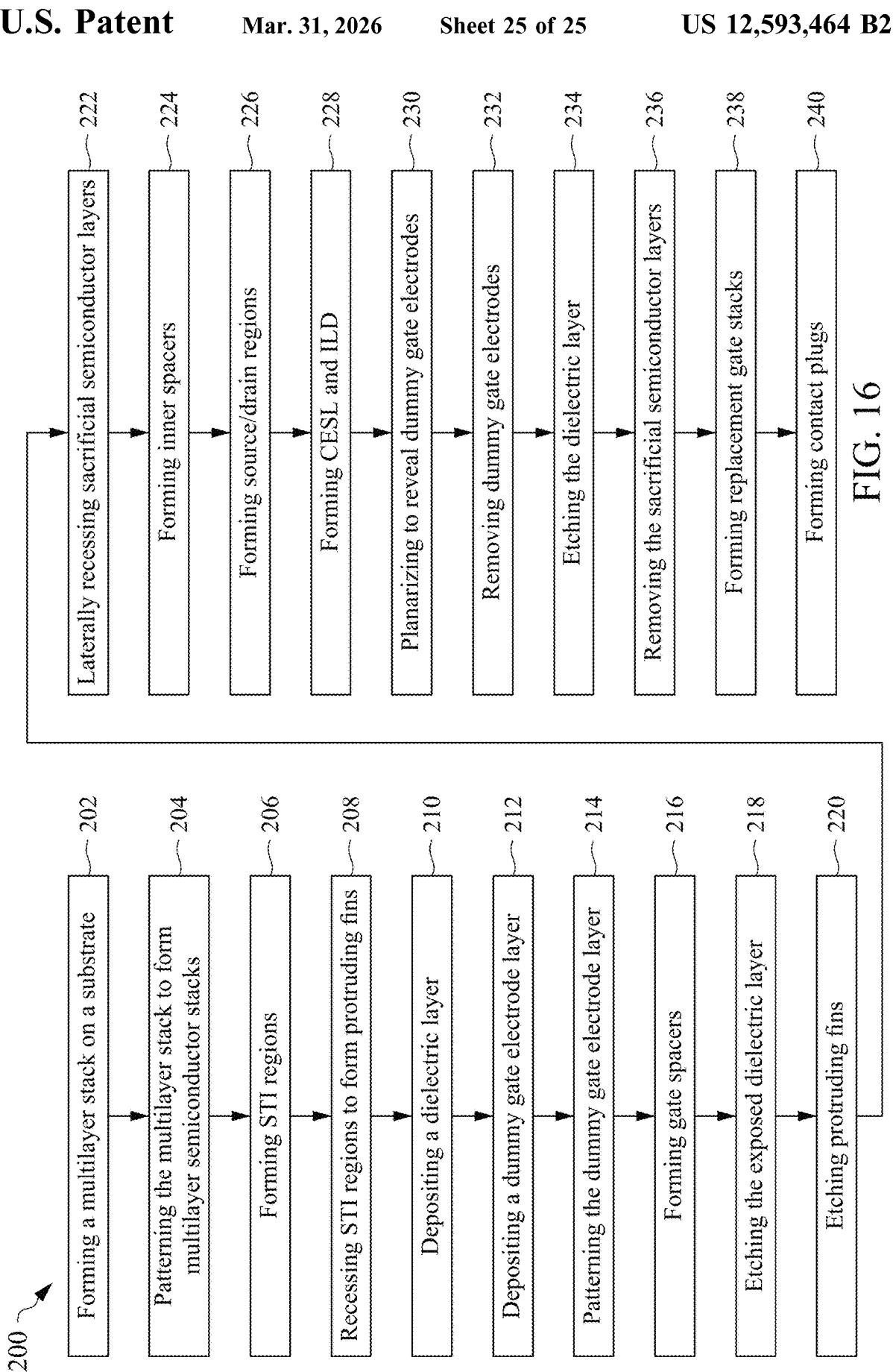
FIG. 16 illustrates a process flow for forming a GAA transistor in accordance with some embodiments.

Referring to FIGS. 4A and 4B, dielectric layer 32 is deposited on the sidewalls and the top surfaces of protruding fins 28, and on the top surface of STI regions 26. The respective process is illustrated as process 210 in the process flow 200 as shown in FIG. 16. FIG. 4A illustrates a perspective view, and FIG. 4B illustrates the vertical cross-section 4B-4B as shown in FIG. 4A. In accordance with some embodiments, dielectric layer 32 is a single (homogeneous) layer, with an entirety of dielectric layer 32 being formed of a same material and having a same composition. Throughout the description, when two layers are referred to as having the same composition, it indicates that the two layers have same elements, and the percentages of the corresponding elements in two layers are the same as each other. Conversely, when two layers are referred to as having different compositions, it indicates that at least one of the two layers either has at least one element not in the other layer, or the two layers have the same elements, but the percentages of the elements in two layers are different from each other.

In accordance with alternative embodiments, dielectric layer 32 is a composite layer including two or more sub layers. For example, FIGS. 4A and 4B illustrate composite layer 32 including lower sub layer 32A, and upper sub layer 32B over lower sub layer 32A. A dashed line (interface) is drawn between lower sub layer 32A and upper sub layer 32B to indicate that dielectric layer 32 may be a single layer (in which embodiments, no interface will be formed therein), or may be a composite layer. When being a composite layer, dielectric layer 32 may include two, three, or more layers, with neighboring layers formed of different dielectric materials.

In accordance with some embodiments in which dielectric layer 32 is a single layer, dielectric layer 32 may be formed of a material that has a lower etching rate than silicon oxide, wherein the etching rate is in response to the etching chemical used for the removal and the cleaning of the subsequently formed dummy gate electrode 34 (FIGS. 13A-13E). In accordance with some embodiments, the cleaning is performed using HF, and dielectric layer 32 may comprise an element (such as carbon and/or nitrogen) other than oxygen. For example, dielectric layer 32 may be formed of or comprise $SiC_x$ (with x being in the range between about 0.8 and about 1), $SiO_xC_y$ (with x and y being in the range between about 0.8 and about 1), $SiO_xN_y$, $SiC_xN_y$, $SiN_x$ (with x being in the range between about 0.8 and 1.33), $SiO_xC_yN_z$ (with x and y being in the range between about 0.1 and about 0.3, and z being in the range between about 0.4 and about 0.6), or the like.

In accordance with alternative embodiments in which dielectric layer 32 is a composite layer, lower sub layer 32A may be formed of $SiO_x$ (with x being in the range between about 0.8 and about 2.0, or in the range between about 0.8 and 1.33. Lower sub layer 32A may also be formed of a non-$SiO_x$ dielectric material, which may be an aforementioned material that has the lower etching rate than silicon oxide in the subsequent removal and cleaning of dummy gate electrodes 34. For example, the non-$SiO_x$ dielectric material may be formed of or comprise $SiC_x$, $SiO_xC_y$, $SiO_xN_y$, $SiC_xN_y$, $SiN_x$, $SiO_xC_yN_z$, or the like.

In accordance with yet alternative embodiments in which dielectric layer 32 is a composite layer, each of lower sub layer 32A and upper sub layer 32B may be formed of or comprise a non-SiOx dielectric material. While the material of lower sub layer 32A and upper sub layer 32B are different from each other, each of the lower sub layer 32A and upper sub layer 32B may be formed of the material (as aforementioned) that has the lower etching rate than silicon oxide in the subsequent removal and cleaning of dummy gate electrodes 34. For example, each of the lower sub layer 32A and upper sub layer 32B may be selected from the same group of candidate materials, which may include $SiC_x$, $SiO_xC_y$, $SiO_xN_y$, $SiC_xN_y$, $SiN_x$, $SiO_xC_yN_z$, or the like.

In accordance with yet alternative embodiments in which dielectric layer 32 is a composite layer, each of lower sub layer 32A and upper sub layer 32B may have a uniform composition. When dielectric layer 32 is a single layer, the entirety of dielectric layer 32 may be deposited as having a uniform composite. In accordance with alternative embodiments, dielectric layer 32 has a gradually changed composition, with different parts including the same elements (such as silicon, oxygen, and nitrogen), while from bottom to top, the percentage of elements are gradually changed. For example, the bottom portion of dielectric layer 32 may comprise $SiO_x$, while the top portion may include $SiAE_y$ (or $SiOAE_y$) wherein "AE" represents an alternative element such as C, N, or any combination including two or three of C, and N and O. From the bottom of dielectric layer 32 to the top of dielectric layer 32, the atomic percentages y of AE increase gradually. This may be achieved, for example, by gradually change the flow rates of precursors when CVD is used. As will be discussed in subsequent paragraphs, the upper sub layer 32B, when formed of a different material than lower sub layer 32A, may act as a firewall for preventing sheet damage.

In accordance with some embodiments, dielectric layer 32 is formed using an Atomic Layer Deposition (ALD) process, which includes a plurality of ALD cycles. Each ALD cycle may include a first stage followed by a second stage. The first stage may include conducting (also referred to as pulsing or feeding) a first precursor into an ALD chamber, purging the first precursor, and turning on plasma. During the pulsing and an initial purging phase in the first stage, the plasma may be turned off. The second stage may include conducting a second precursor into the ALD chamber, purging the second precursor, and turning on plasma. During the pulsing and an initial purging phase in the second stage, the plasma may be turned off. The plasma may also be turned on for the second stage, but not for the first stage. The purging gas may include $N_2$, Ar, Ne, Kr, He, or the like, or combinations thereof. The plasma treatment may be performed in process gases including $N_2$, Ar, Ne, Kr, He, $O_2$, $NH_3$, $N_2O$, or the like, or combinations thereof.

In accordance with some embodiments, the first precursor includes a silicon-containing precursor, which may include silane, di-silane, aminosilanes, di-sec-butylaminosilane (DSBAS), bis(tert-butylamino)silane (BTBAS), or the like, or combinations thereof. The second precursor may include another element(s) such as C, N, and/or O. For example, the second precursor may comprise ammonia when N is to be included in dielectric layer. The resulting dielectric layer 32 may include SiC, SiN, SiO, SiCN, SiOCN, SiON, or the like, or combinations thereof.

In accordance with alternative embodiments, dielectric layer 32 may be formed using other deposition methods such as CVD. The composition of dielectric layer 32 may be controlled by adjusting the flow rates of the corresponding precursors. In accordance with some embodiments in which the composition of dielectric layer 32 changes gradually, the flow rates and the ratio of the flow rates of the precursors may be changed gradually when the deposition of dielectric layer 32 proceeds.

In accordance with some embodiments, as shown in subsequently illustrated FIGS. 5 and 6, dummy gate electrode layer 34 is patterned in an anisotropic etching process, and the patterning process is performed using dielectric layer 32 as an etch stop layer. Due to process variations, the top portions of dielectric layer 32 on top of protruding fins 28 may be damaged, and may also have loss more than the vertical portions of dielectric layer 32 on the sidewalls of protruding fins 28. When the top portions of dielectric layer 32 are damaged or removed due to process variations, the top nanostructure 22B may be exposed and suffer from loss. This results in process degradation and deviation. Accordingly, dielectric layer 32 may be formed as having a top thickness greater than the sidewall thickness, so that a greater process margin is provided for the top nanostructure loss.

FIG. 4B illustrates a vertical cross-sectional view 4B-4B in FIG. 4A. Dielectric layer 32 includes a top portion 32T directly over protruding fins 28, and the top thickness of the top portion is denoted as T1 (including T1A, T1B, and T1C). Thickness T1 may be measured at a middle vertical line of the corresponding protruding fin 28. In accordance with some embodiments, top portion 32T has a uniform thickness. For example, as shown in FIG. 4B, thicknesses T1A, T1B, and T1C may be the same, with variations smaller than about 10 percent or less.

Dummy gate dielectric layer 32 further includes sidewall portions 32S on the sidewalls of protruding fins 28, and horizontal portions 32H overlapping and contacting the top surfaces of STI regions 26. The thickness T3 of the horizontal portions 32H may be equal to thickness T2, with both of thickness T2 and thickness T3 being smaller than thickness T1. Accordingly, dielectric layer 32 is a non-conformal layer. In accordance with some embodiments, each of thickness ratios T1/T2 and T1/T3 is greater than about 1.5, and may be greater than about 2.0 (such as in the range between about 2 and about 5). When one or more of lower sub layer 32A and upper sub layer 32B is non-conformal, the thickness ratios T1'/T2' and T1"/T2" may also be greater than about 1.5, and may be greater than about 2.0 such as in the range between about 2 and about 5. Thicknesses T1' and T2' are the top thickness and the sidewall thickness, respectively, of lower sub layer 32A. Thicknesses T1" and T2" are the top thickness and the sidewall thickness, respectively, of upper sub layer 32B.

In accordance with some embodiments, the top thickness T1 may be in the range between about 30 Å and about 50 Å. The sidewall thickness T2 and bottom thickness T3 may be in the range between 20 Å and about 30 Å.

In accordance with some embodiments in which dielectric layer 32 includes two or more dielectric layers, zero, one, or more of the sub layers in dielectric layer 32 may have the non-conformal profiles as aforementioned in any combination, while the other sub layer(s) (if any) may be conformal. For example, when there are two sub layers, the lower sub layer 32A may have a conformal profile, while upper sub layer 32B may have a non-conformal profile. Such a profile allows upper sub layer 32B to stop the etching in the subsequent patterning of dummy gate electrode layer. In accordance with alternative embodiments, the lower sub layer 32A may have a non-conformal profile, while upper sub layer 32B may have a conformal profile. In accordance with yet alternative embodiments, both of lower sub layer 32A and upper sub layer 32B have non-conformal profiles.

To achieve the non-conformal profile for dielectric layer 32, a CVD-mode ALD process is adopted, in which the ALD process conditions are adjusted to achieve a greater top thickness than sidewall thickness. The adjustment of process conditions may include reducing the precursor conduction time (feeding time), so that there is less time for the precursors to diffuse to the bottoms of trenches between protruding fins 28, and there is less adsorption time for the precursors. The adjustment of process conditions may also include increasing the pressure of the precursor in the precursor conduction. The adjustment of process conditions may also include reducing the plasma turn-on time (referred to as plasma treatment time hereinafter) so that less reaction occurs.

In accordance with some embodiments, in an ALD cycle for forming the non-conformal dielectric layer 32, the precursor conduction time may be in the range between about 0.01 seconds and about 0.2 seconds. The pressure may be in the range between about 2 torr and about 3.5 torr. The plasma treatment time may be in the range between about 0.1 seconds and about 3 seconds.

It is appreciated that the profile of dielectric layer 32 may be the results of various factors in combination. Accordingly, experiments may be performed to find the desirable combination of process conditions in order to achieve the desirable profile. The experiments may include forming a plurality of sample dielectric layers 32 on a plurality of sample wafers. In the formation, a plurality of different combinations of the process conditions such as the pressure, the precursor conduction time, the plasma treatment time, or the like, are used to form the plurality of sample dielectric layers. The profiles of the sample dielectric layers are measured to determine the correlation between the process conditions and the profiles of the dielectric layers. Desirable process conditions may thus be selected to be the ones resulting in the desirable profile of dielectric layer 32.

It is appreciated that a dummy dielectric layer may be formed simultaneously with the gate oxide of an IO transistor in related processes. In accordance with the embodiments of the present disclosure, since the materials and the structures of dielectric layer 32 are different from that of the gate oxide of IO transistors, the formation of dielectric layer 32 and the formation of the gate oxide of IO transistors are decoupled, and are formed in separate processes, and have different structures. For example, the gate oxides of IO transistors may be formed of silicon oxide, and may be conformal, while dielectric layer 32 of the GAA transistors may be formed of the aforementioned materials, and may be non-conformal.

Figure 5:
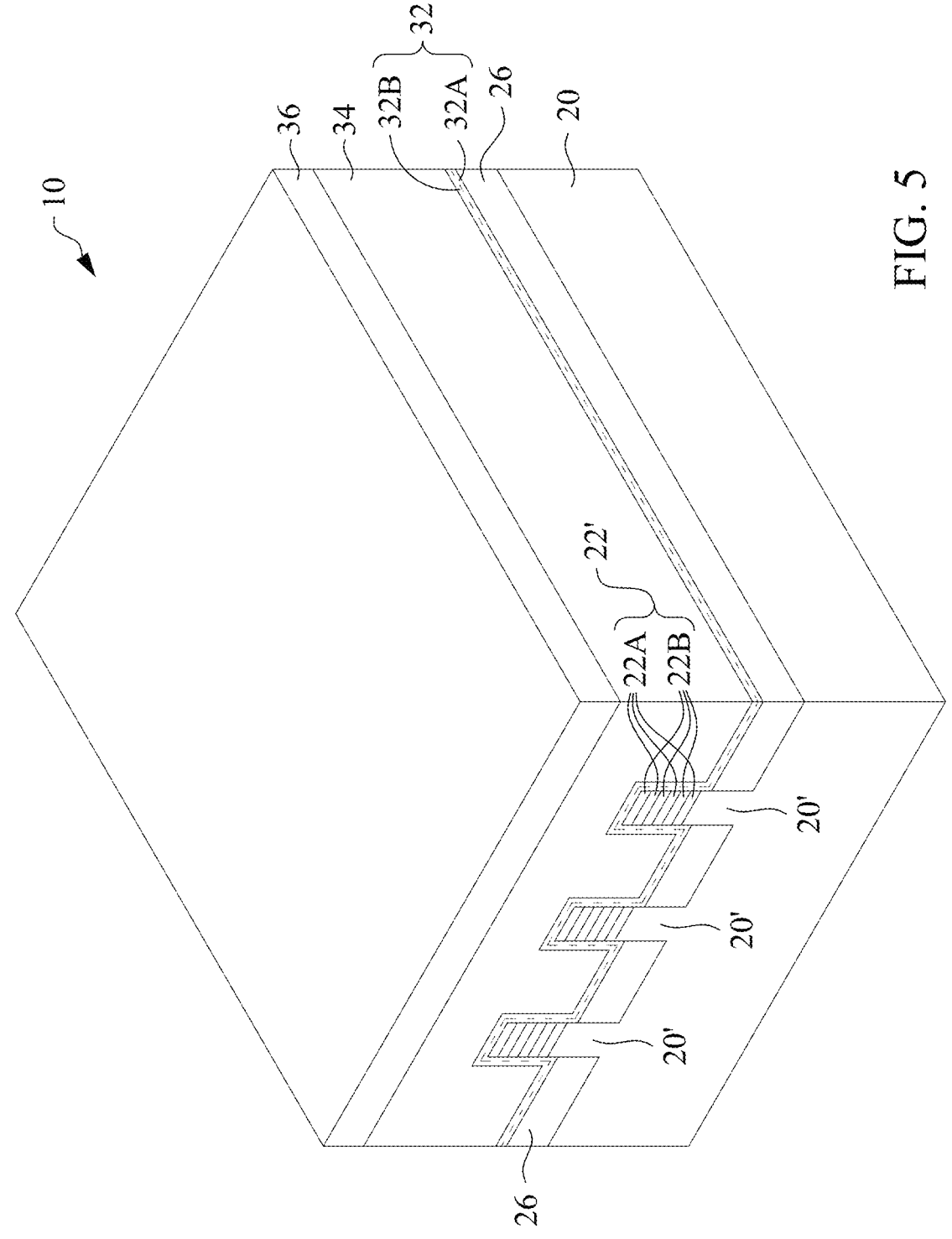

Referring to FIG. 5, dummy gate electrode layer 34 is deposited. The respective process is illustrated as process 212 in the process flow 200 shown in FIG. 16. A planarization process is then performed to level the top surface of dummy gate electrode layer 34. Dummy gate electrode layer 34 may be formed, for example, using polysilicon or amorphous silicon, and other materials such as amorphous carbon may also be used. One (or a plurality of) hard mask layer 36 is also formed over dummy gate electrode layer 34. Hard mask layers 36 may be formed of silicon nitride, silicon oxide, silicon carbo-nitride, silicon oxy-carbo nitride, or multilayers thereof.

Figure 6:
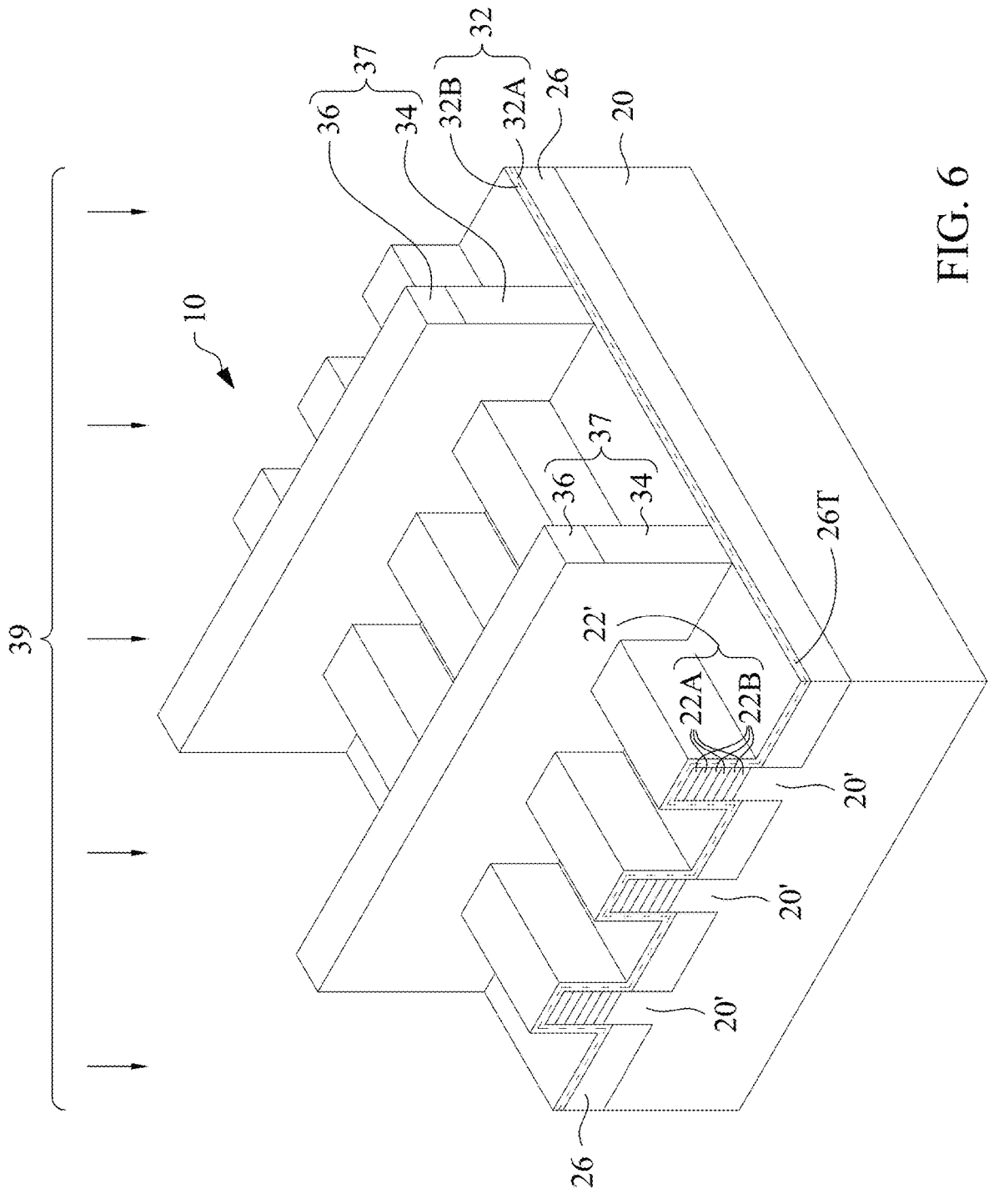

Referring to FIG. 6, hard mask layer 36 and dummy gate electrode layer 34 are patterned in etching process 39 to form dummy gate stacks 37, which include hard masks 36 and dummy gate electrodes 34. The respective process is illustrated as process 214 in the process flow 200 shown in FIG. 16. The resulting structure is shown in FIG. 6. In accordance with some embodiments, the patterning process is performed through an anisotropic etching process. The etching gas may include fluorine ($F_2$), Chlorine ($Cl_2$), hydrogen chloride (HCl), hydrogen bromide (HBr), Bromine ($Br_2$), $C_2F_6$, $CF_4$, $SO_2$, the mixture of HBr, $Cl_2$, and $O_2$, or combinations thereof. The etching is performed using dielectric layer 32 as the etch stop layer. In accordance with some embodiments, by selecting proper combination of the material of dielectric layer 32 and the etching chemical, the etching rate of dielectric layer 32 is lower than the etching rate of silicon oxide. As a result, the dielectric layer 32 in the embodiments of the present disclosure stops the etching better than silicon oxide, which may also be the gate oxides of IO transistors (which may be formed in the same wafer/die as the GAA transistors).

Since etching process 39 is anisotropic, the top portion of dielectric layer 32 suffers more loss from the sidewall portions. With the top portions of dielectric layer 32 being thicker, the possibility of the full removal of the top portion of dielectric layer 32 by patterning process 39 is reduced. Accordingly, the underlying top nanostructure 22B is less likely to be etched, or the loss is less if etched. For example, $SiO_x$ and $SiO_xC_yN_z$ may have etching rates in the range between about 80 Å/minute and about 120 Å/minute during patterning process 39. On the other hand, $SiC_x$ and $SiC_xN_y$ may have significantly lower etching rates, which may be in the range between about 1 Å/minute and about 5 Å/minute. $SiN_x$ may also have a significantly lower etching rate, which may be in the range between about 10 Å/minute and about 20 Å/minute.

In accordance with some embodiments in which dielectric layer 32 is a composite layer, one, but not both, of upper sub layer 32B and lower sub layer 32A is non-conformal, the etching rate (in patterning process 39) of the non-conformal sub layer may also be lower than the etching rate of the conformal sub layer in order to minimize the possibility of the fully removal of the top portion of dielectric layer 32.

Figure 7:
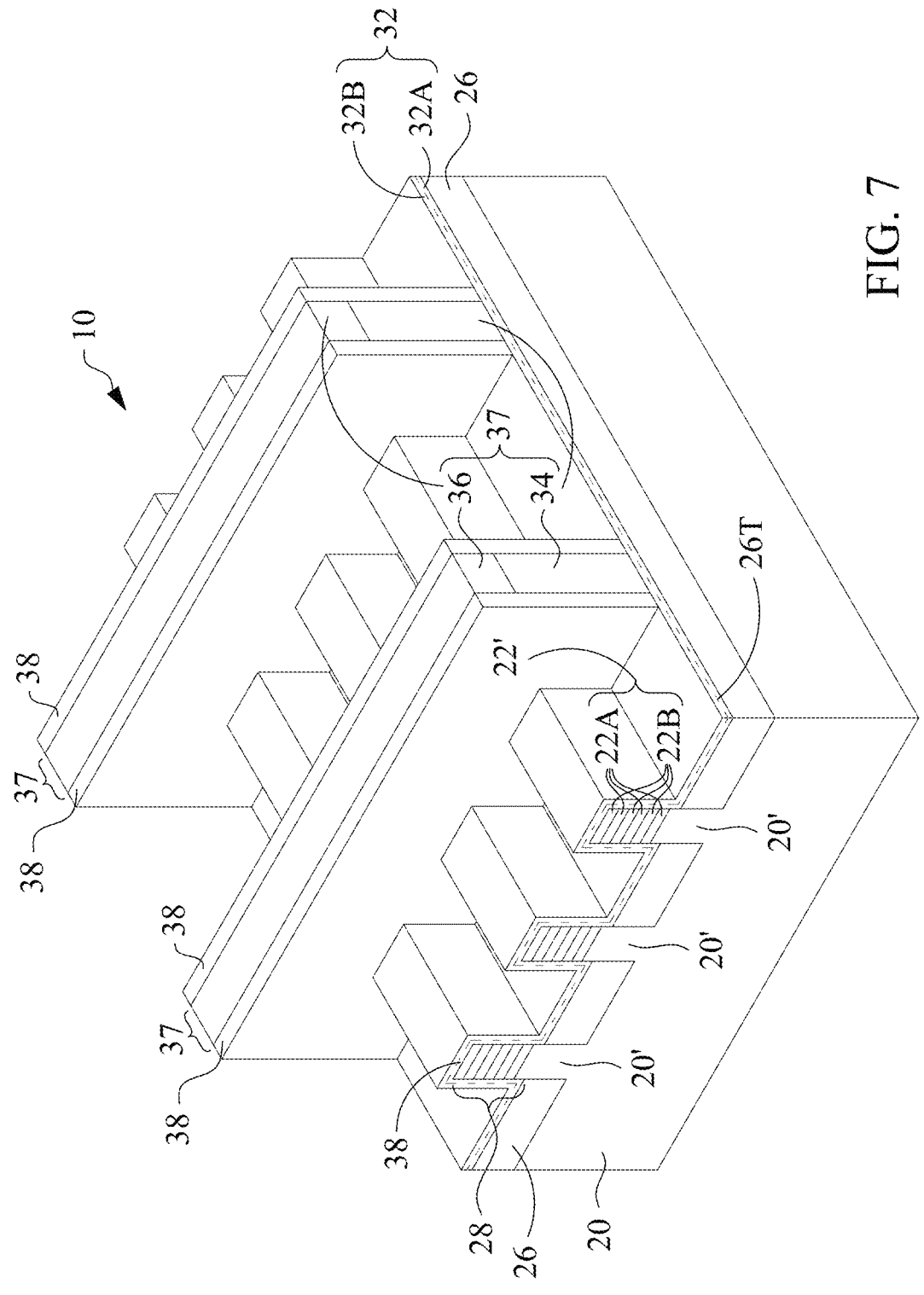

Next, as shown in FIG. 7, gate spacers 38 are formed on the sidewalls of dummy gate stacks 37. The respective process is illustrated as process 216 in the process flow 200 shown in FIG. 16. In accordance with some embodiments, gate spacers 38 are formed of a dielectric material such as silicon nitride (SiN), silicon oxide ($SiO_2$), silicon carbonitride (SiCN), silicon oxynitride (SiON), silicon oxy-carbonitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 8B:
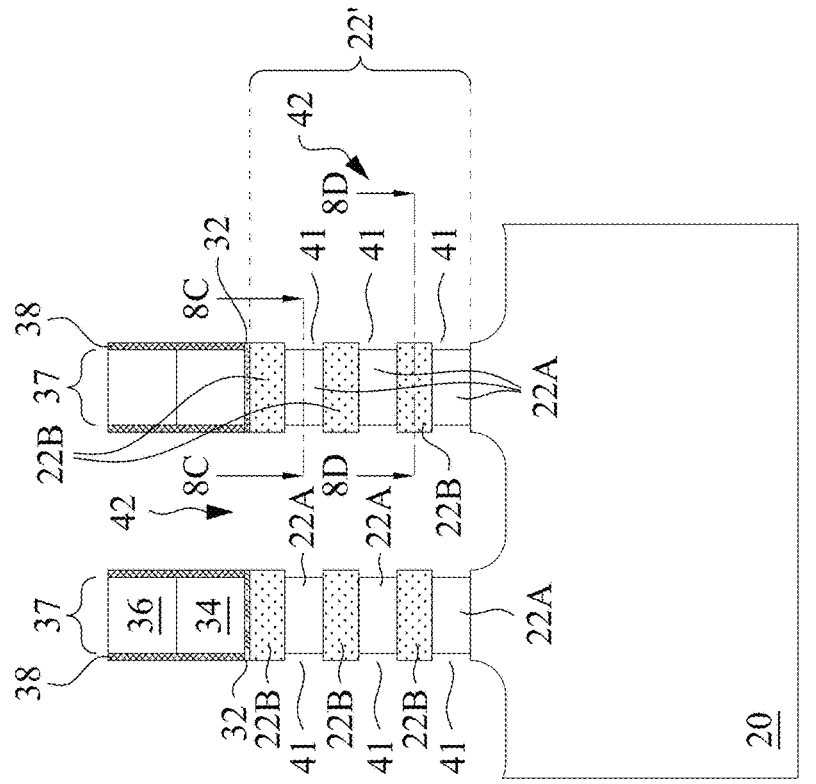
Figure 8A:
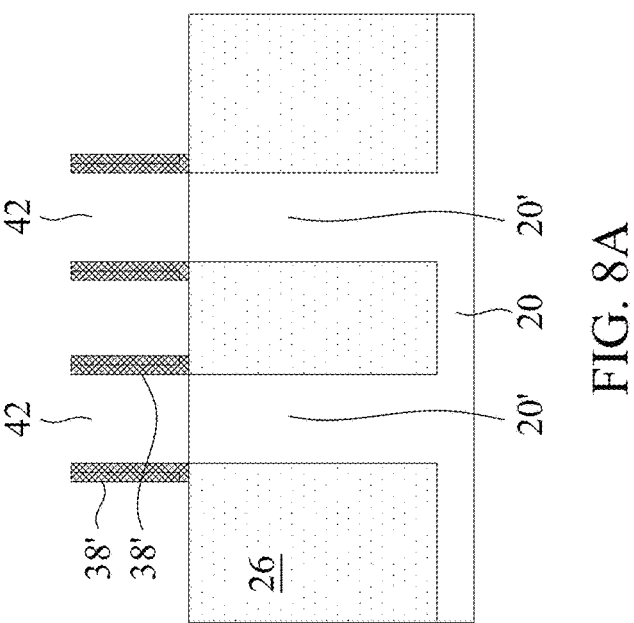
Figure 8D:
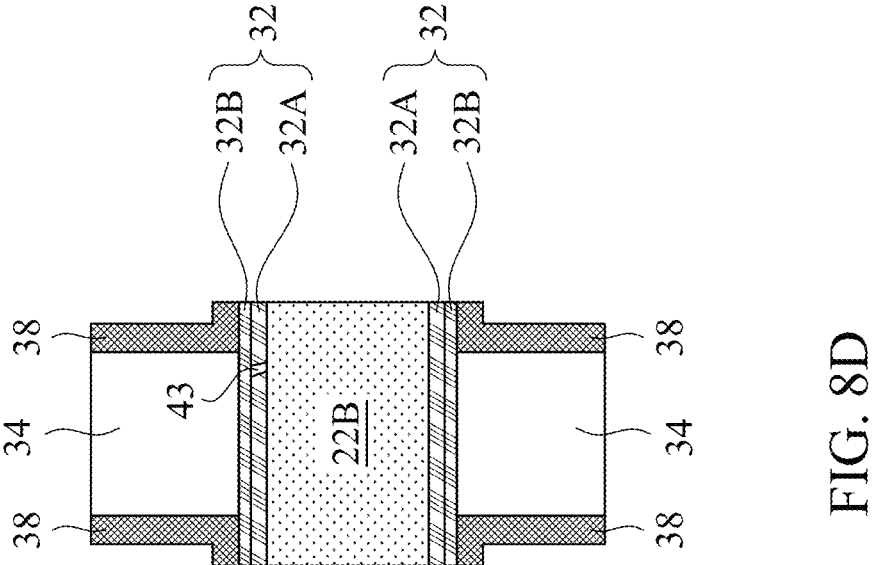
Figure 8C:
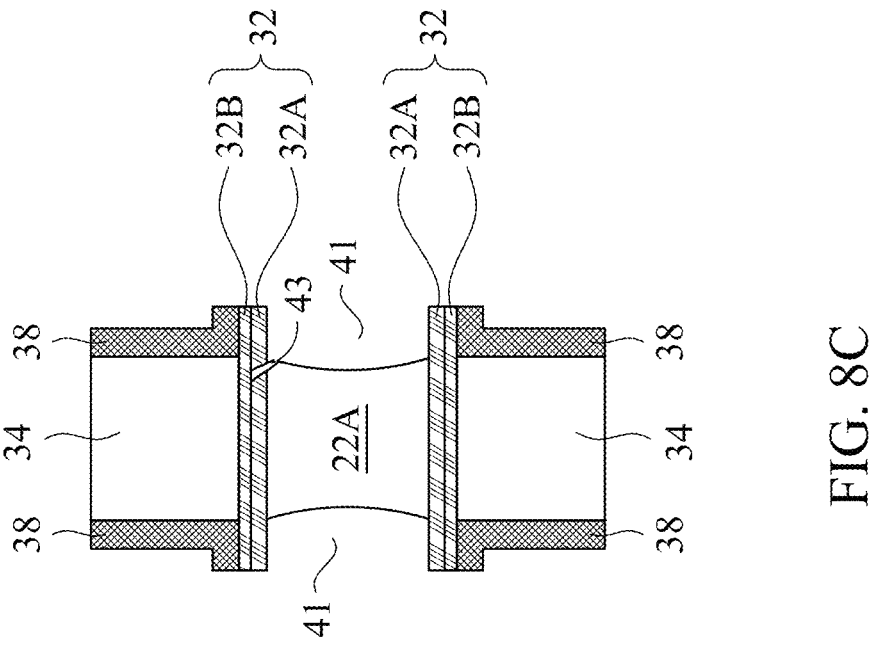
Figure 8E:
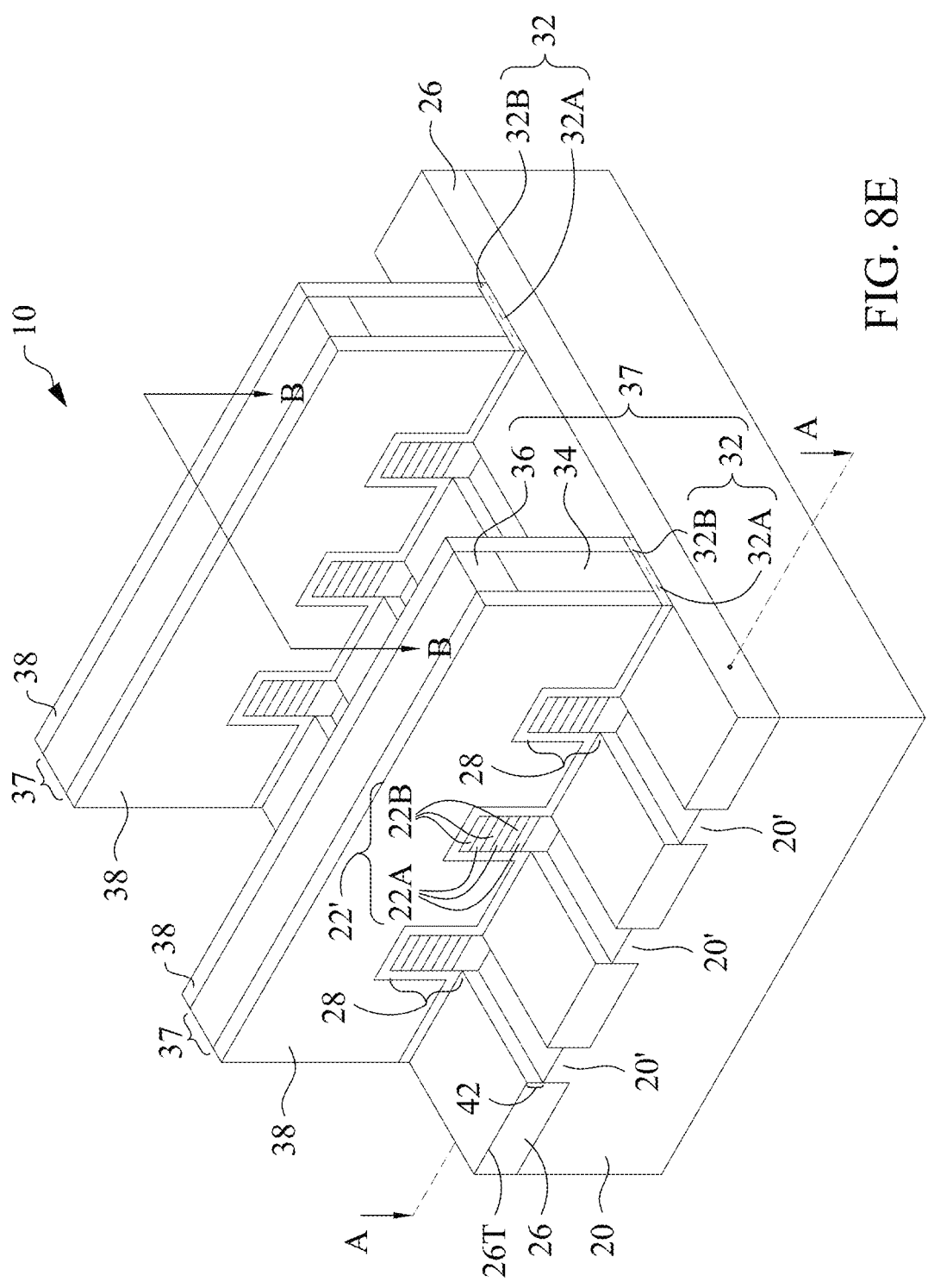

FIGS. 8A, 8B, and 8E illustrate the formation of recesses 42, from which epitaxy regions are formed. FIGS. 8A and 8B illustrate the cross-sectional views of the structure shown in FIG. 8E. FIG. 8A illustrates the vertical cross-section A-A in FIG. 8E, which cross-section cuts through the portions of protruding fins 28 not covered by dummy gate stacks 37 and gate spacers 38. Fin spacers 38', which are on the sidewalls of protruding fins 28, are also illustrated in FIG. 8A. FIG. 8B illustrates the reference cross-section B-B in FIG. 8E, which reference cross-section is parallel to the lengthwise directions of protruding fins 28.

As shown in FIGS. 8A, 8B, and 8E, exposed portions of dielectric layer 32 are etched. The respective process is illustrated as process 218 in the process flow 200 shown in FIG. 16. The portions of dielectric layer 32 and protruding fins 28 that are directly underlying dummy gate stacks 37 and gate spacers 38 remain after the etching process. The respective process is illustrated as process 220 in the process flow 200 shown in FIG. 16. The remaining portions of dielectric layer 32 are considered as parts of dummy gate stacks 37. In accordance with some embodiments, the etching process comprises a dry etch process performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than, the bottoms of multilayer semiconductor stacks 22'. The etching may be anisotropic, so that the sidewalls of multilayer semiconductor stacks 22' facing recesses 42 are vertical and straight.

Referring to FIG. 8B, sacrificial semiconductor layers 22A are laterally recessed to form lateral recesses 41, which are recessed from the edges of the respective overlying and underlying nanostructures 22B. The respective process is illustrated as process 222 in the process flow 200 shown in FIG. 16. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

FIGS. 8C and 8D illustrate the top views of the structure shown in FIG. 8B, wherein the top views are obtained from horizontal planes 8C-8C and 8D-8D passing through sacrificial semiconductor layers 22A and nanostructure 22B, respectively. Referring to FIGS. 8C and 8D, the edges of nanostructures 22B may be aligned to the inner edges of gate spacers 38. FIG. 8C shows that the edges of sacrificial semiconductor layer 22A are laterally recessed. As a result, some inner portions of lower sub layer 32A of dielectric layer 32 may be revealed.

There may be damages occurring to lower sub layer 32A in the lateral recessing of sacrificial semiconductor layer 22A, and in the subsequent cleaning process. This may cause through-channels (air gap) 43 to be formed in lower sub layer 32A. In accordance with some embodiments, upper sub layer 32B is resistant to the chemicals used in the lateral recessing of sacrificial semiconductor layer 22A and the subsequent cleaning process, and hence through-channels 43 will be blocked by upper sub layer 32B. Alternatively stated, the etching rate of upper sub layer 32B is lower than lower sub layer 32A.

Figure 9B:
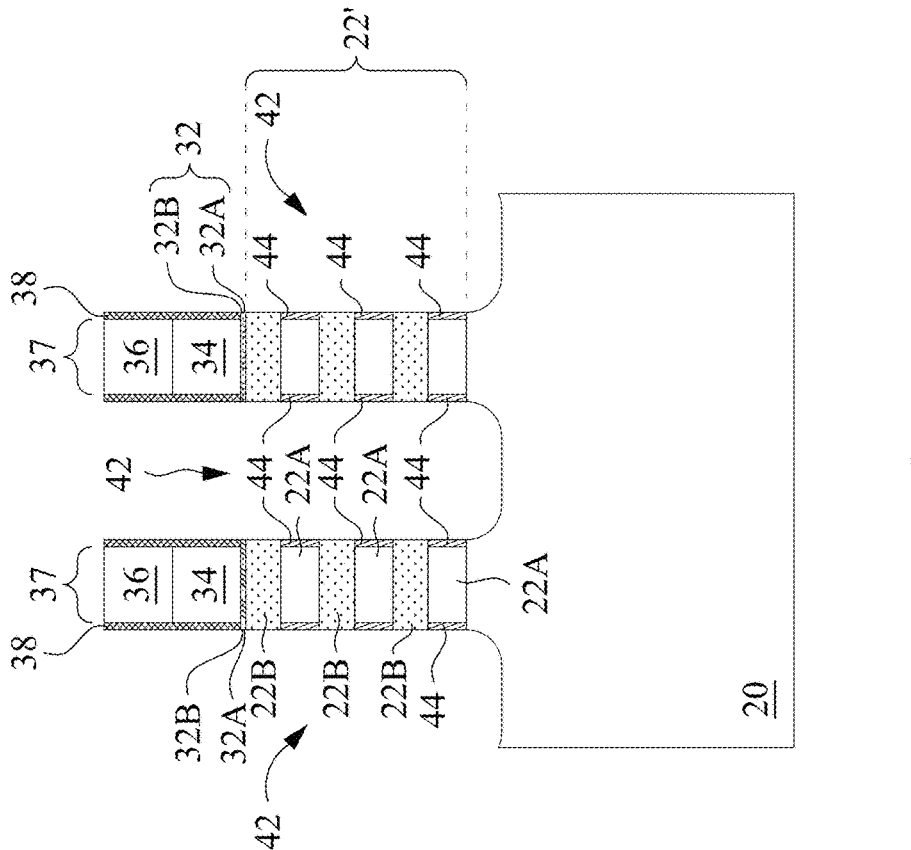
Figure 9A:
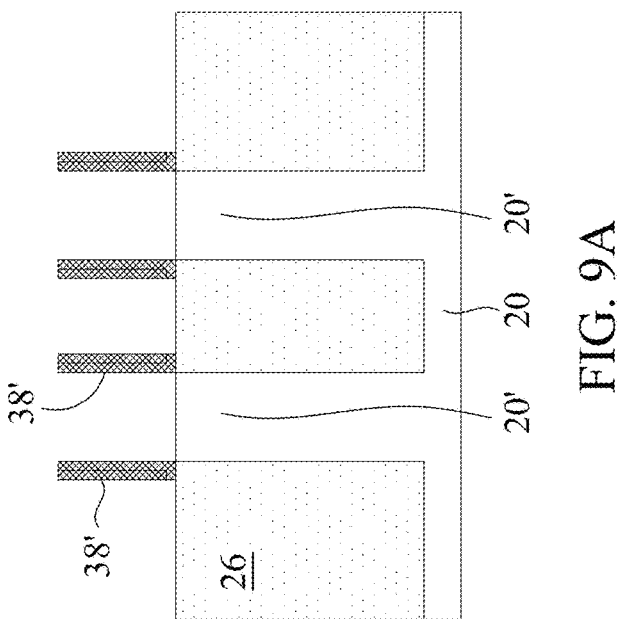

FIGS. 9A and 9B illustrate the formation of inner spacers 44. The respective process is illustrated as process 224 in the process flow 200 shown in FIG. 16. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 10B:
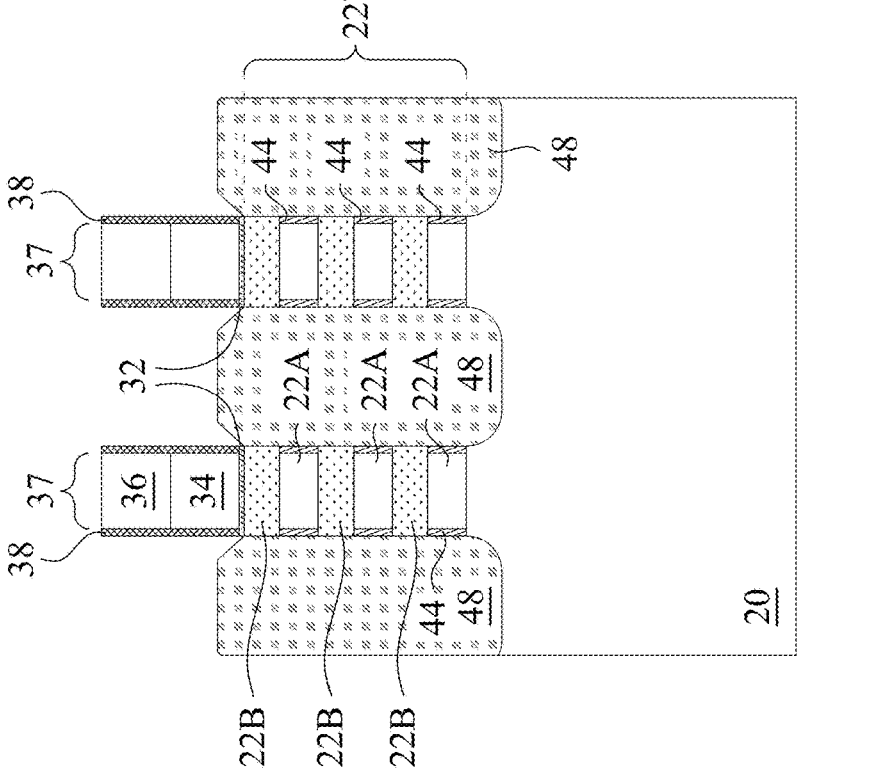
Figure 10A:
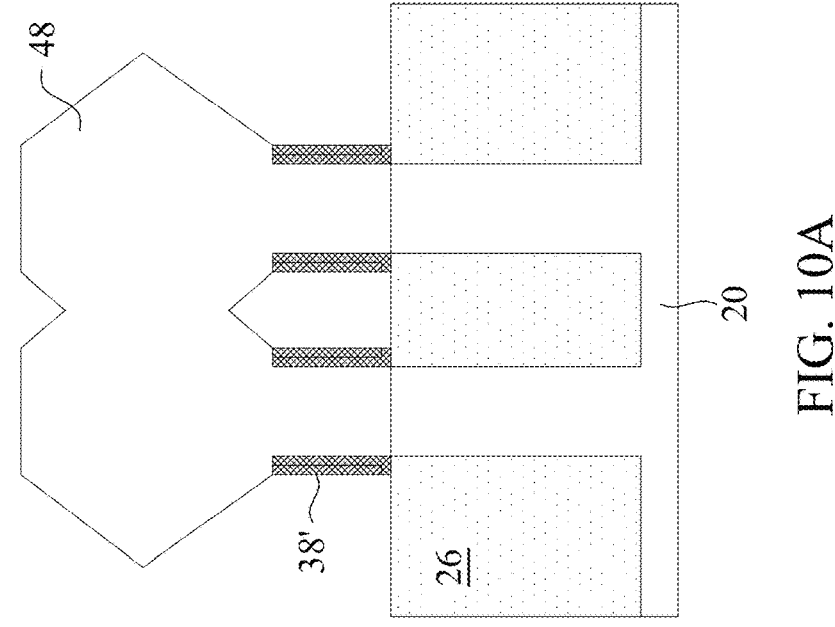
Figure 10C:
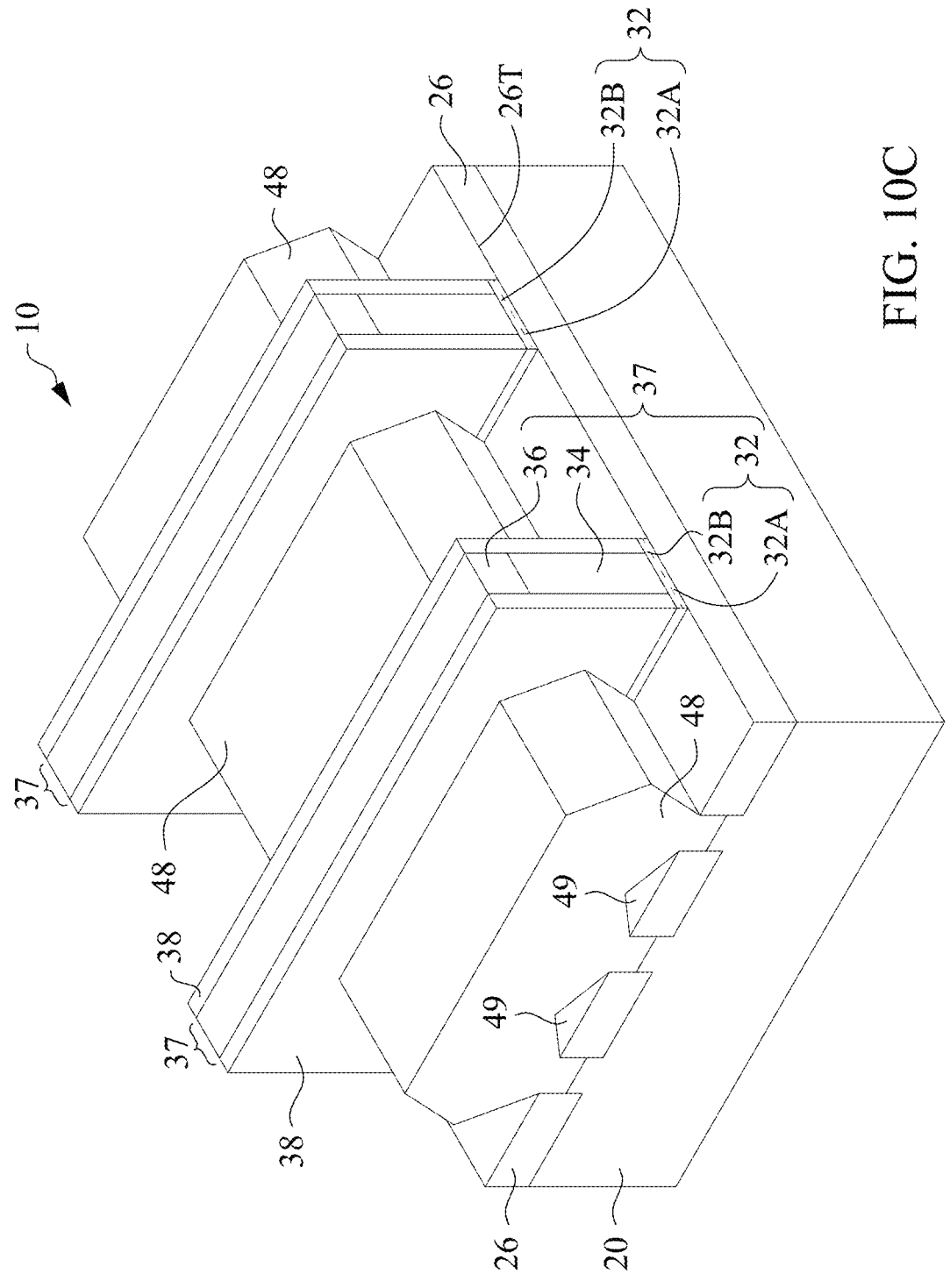

FIGS. 10A, 10B, and 10C illustrate the cross-sectional views and a perspective view in the formation source/drain regions 48 in recesses 42 through epitaxy. The respective process is illustrated as process 226 in the process flow 200 shown in FIG. 16. Source/drain region(s) may refer to a source or a drain, individually or collectively dependent upon the context. In accordance with some embodiments, the source/drain regions 48 may exert stress on the nanostructures 22B, which are used as the channels of the corresponding GAA transistors, thereby improving performance.

In accordance with some embodiments, the corresponding transistor is n-type, and epitaxial source/drain regions 48 are accordingly formed as n-type by doping an n-type dopant. For example, silicon phosphorous (SiP), silicon carbon phosphorous (SiCP), or the like may be grown to form epitaxial source/drain regions 48. In accordance with alternative embodiments, the corresponding transistor is p-type, and epitaxial source/drain regions 48 are accordingly formed as p-type by doping a p-type dopant. For example, silicon boron (SiB), silicon germanium boron (SiGeB), or the like may be grown to form epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other, with voids 49 (FIG. 10C) being formed.

After the epitaxy process, epitaxy regions 48 may be further implanted with an n-type impurity or a p-type impurity to form source and drain regions, which are also denoted using reference numeral 48. In accordance with alternative embodiments of the present disclosure, the implantation process is skipped when epitaxy regions 48 are in-situ doped with the n-type impurity or p-type impurity during the epitaxy, and the epitaxy regions 48 are also source/drain regions.

Figure 11B:
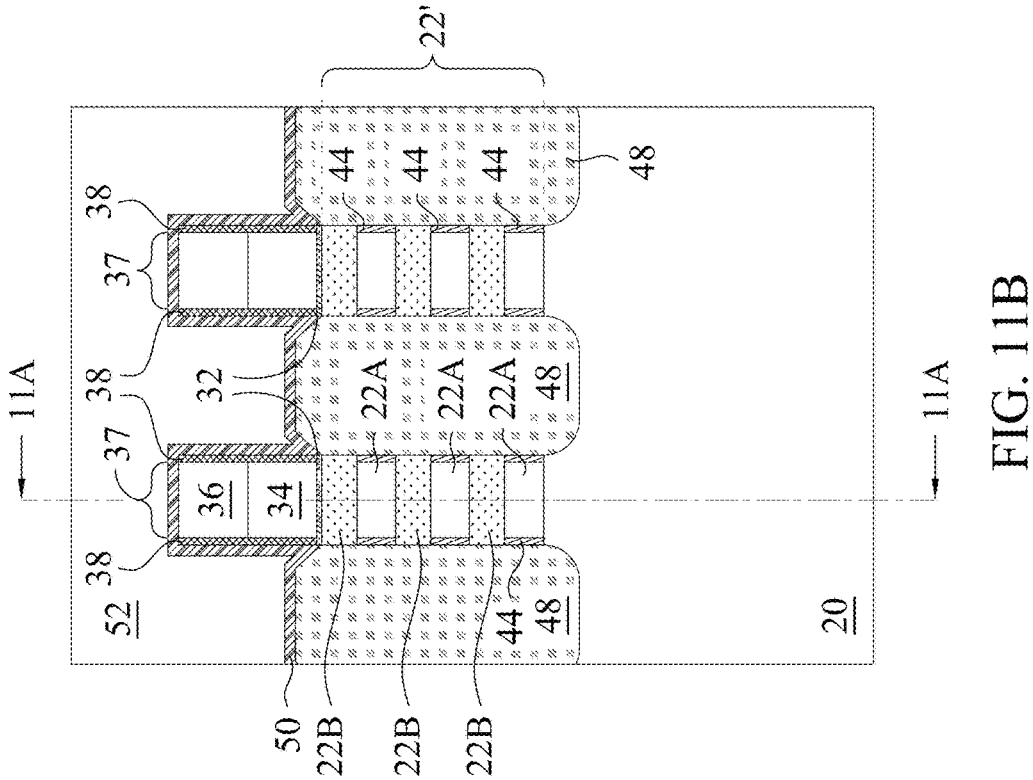
Figure 11A:
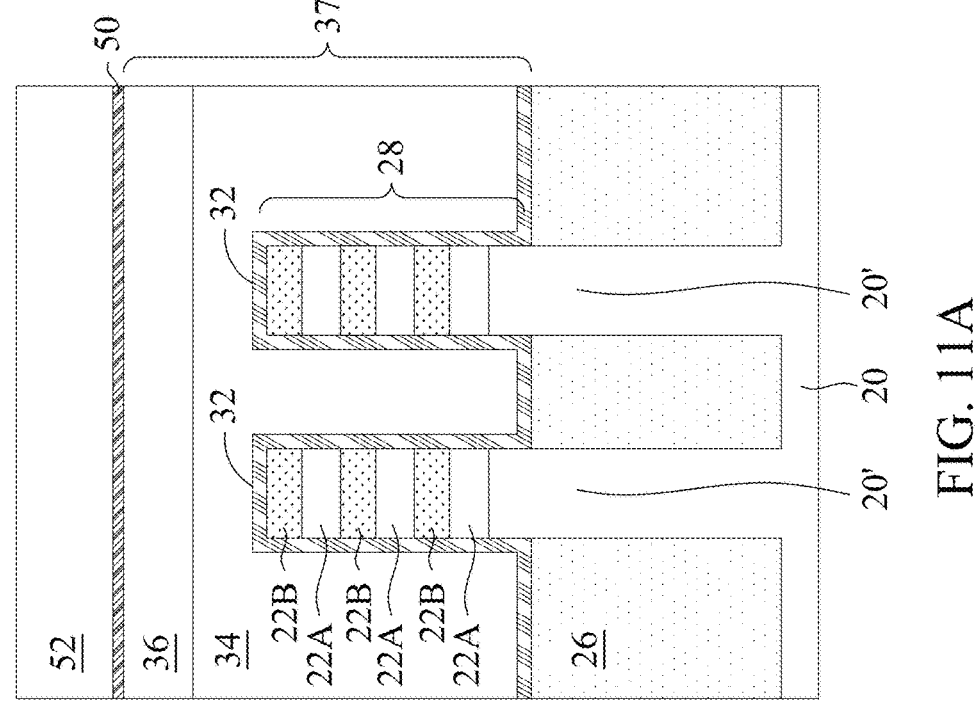
Figure 11C:
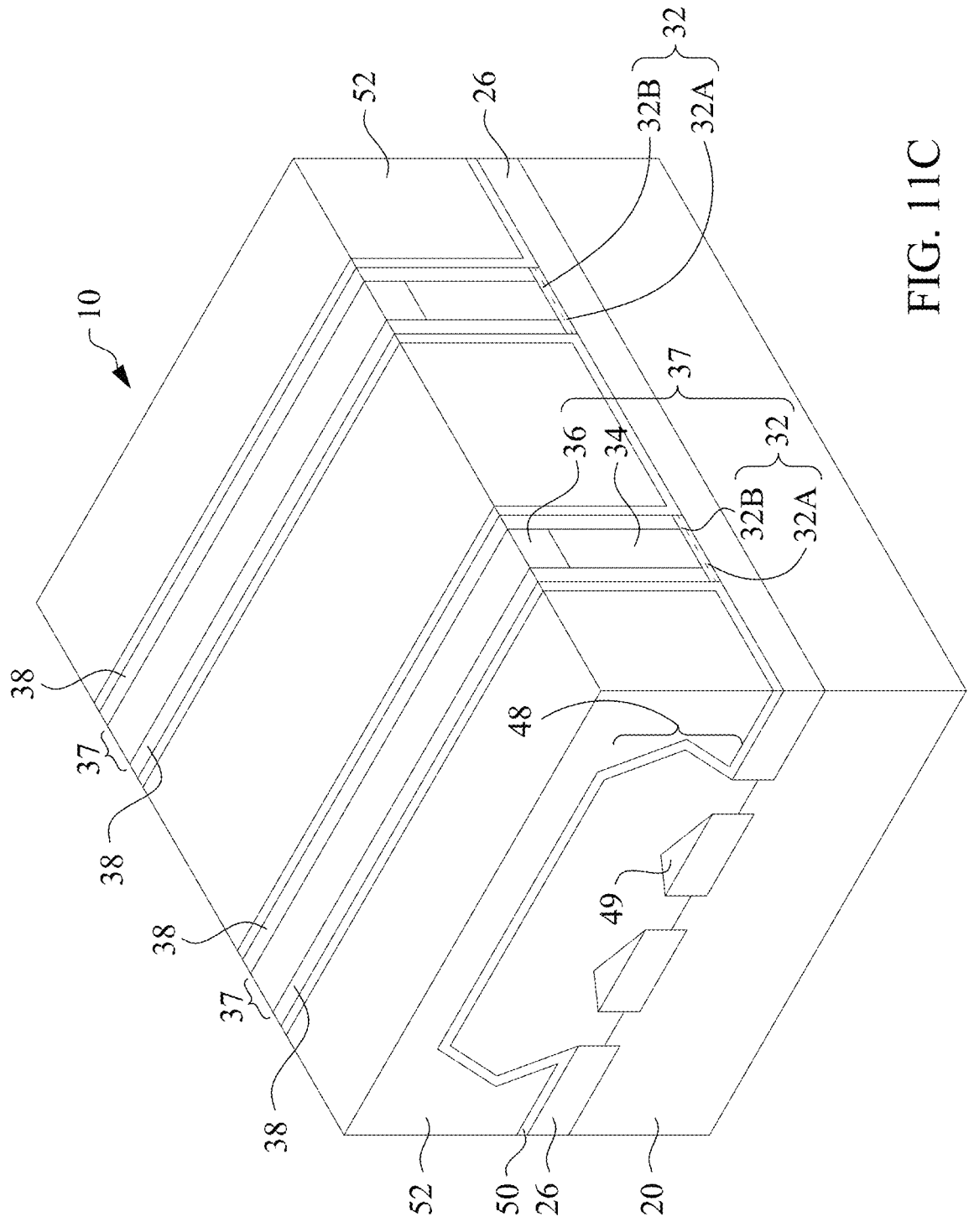

FIGS. 11A, 11B, and 11C illustrate the cross-sectional views and a perspective view of the structure after the formation of Contact Etch Stop Layer (CESL) 50 and Inter-Layer Dielectric (ILD) 52. The respective process is illustrated as process 228 in the process flow 200 shown in FIG. 16. FIG. 11A illustrates the cross-section 11A-11A in FIG. 11B. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), Undoped Silicate Glass (USG), or the like.

Figure 12B:
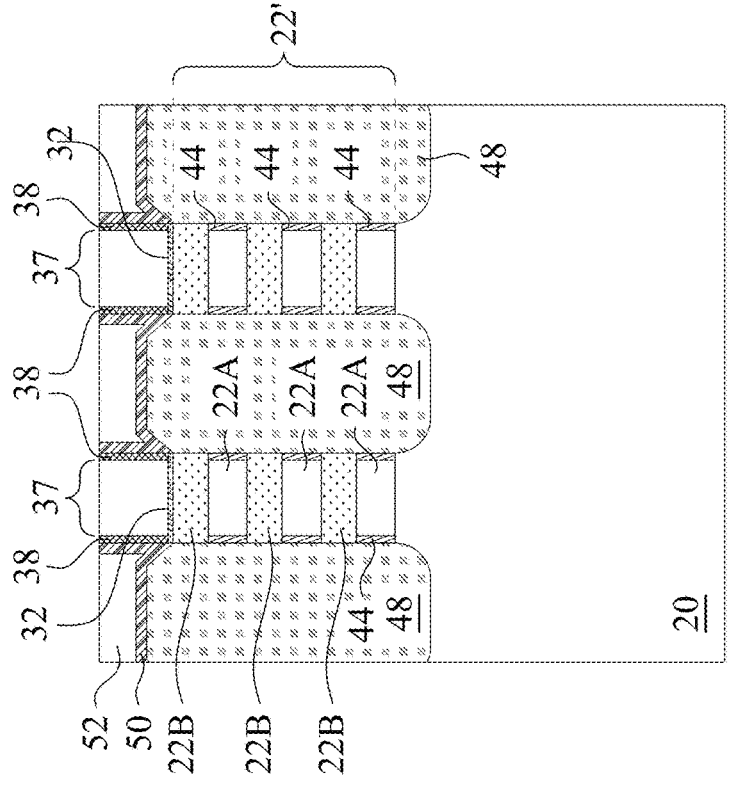
Figure 12A:
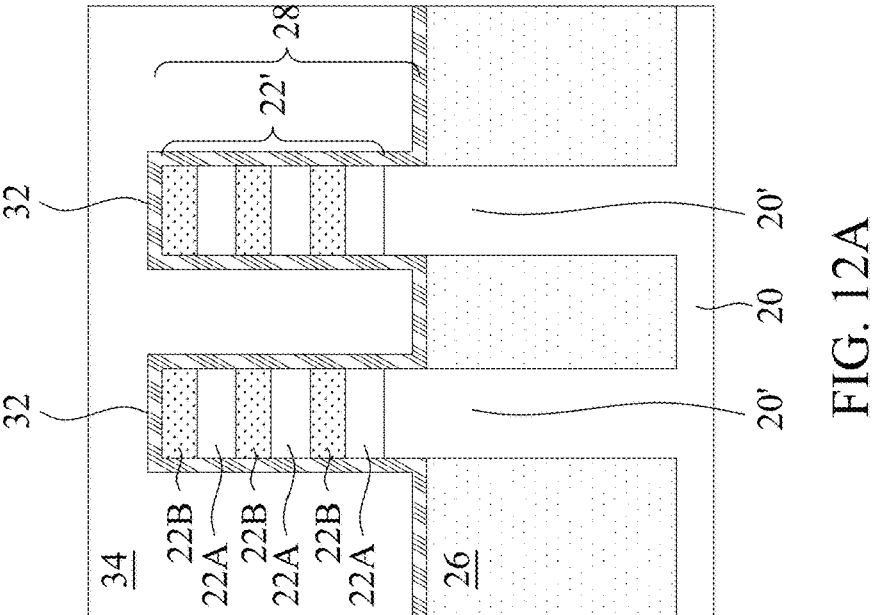

FIGS. 12A and 12B through FIGS. 15A and 15B illustrate the process for forming replacement gate stacks and contact plugs. In FIGS. 12A and 12B, a planarization process such as a CMP process or a mechanical grinding process is performed to level the top surface of ILD 52. In accordance with some embodiments, the planarization process may remove hard masks 36 to reveal dummy gate electrodes 34, as shown in FIG. 12A. The respective process is illustrated as process 230 in the process flow 200 shown in FIG. 16. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 13B:
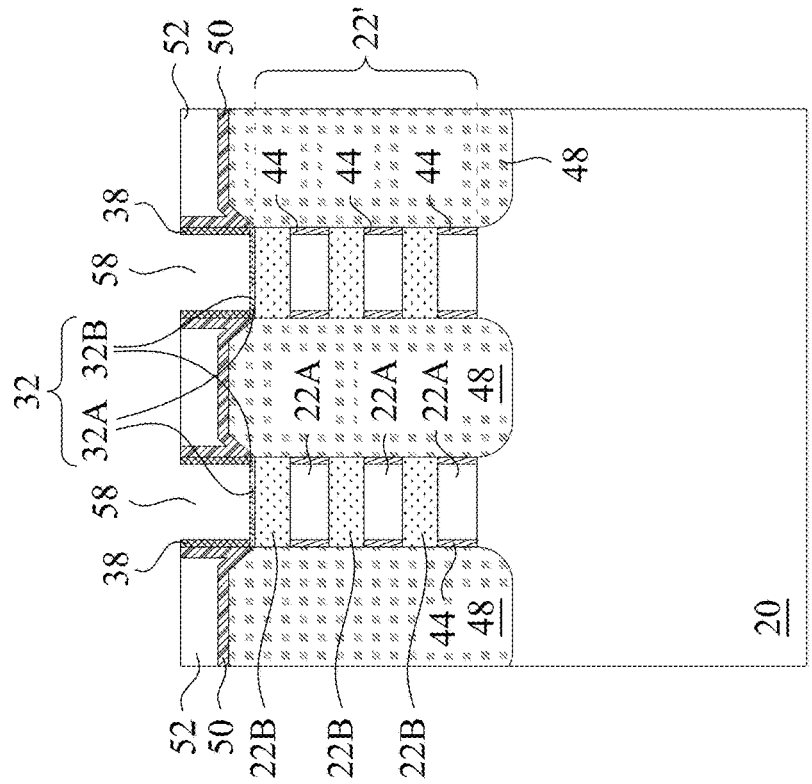
Figure 13A:
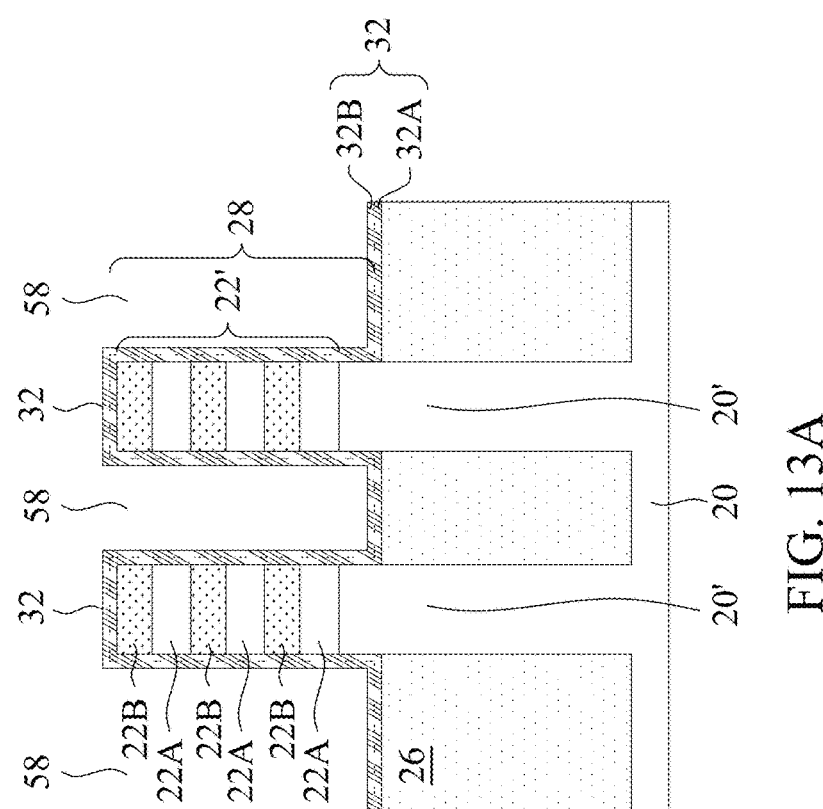
Figure 13C:
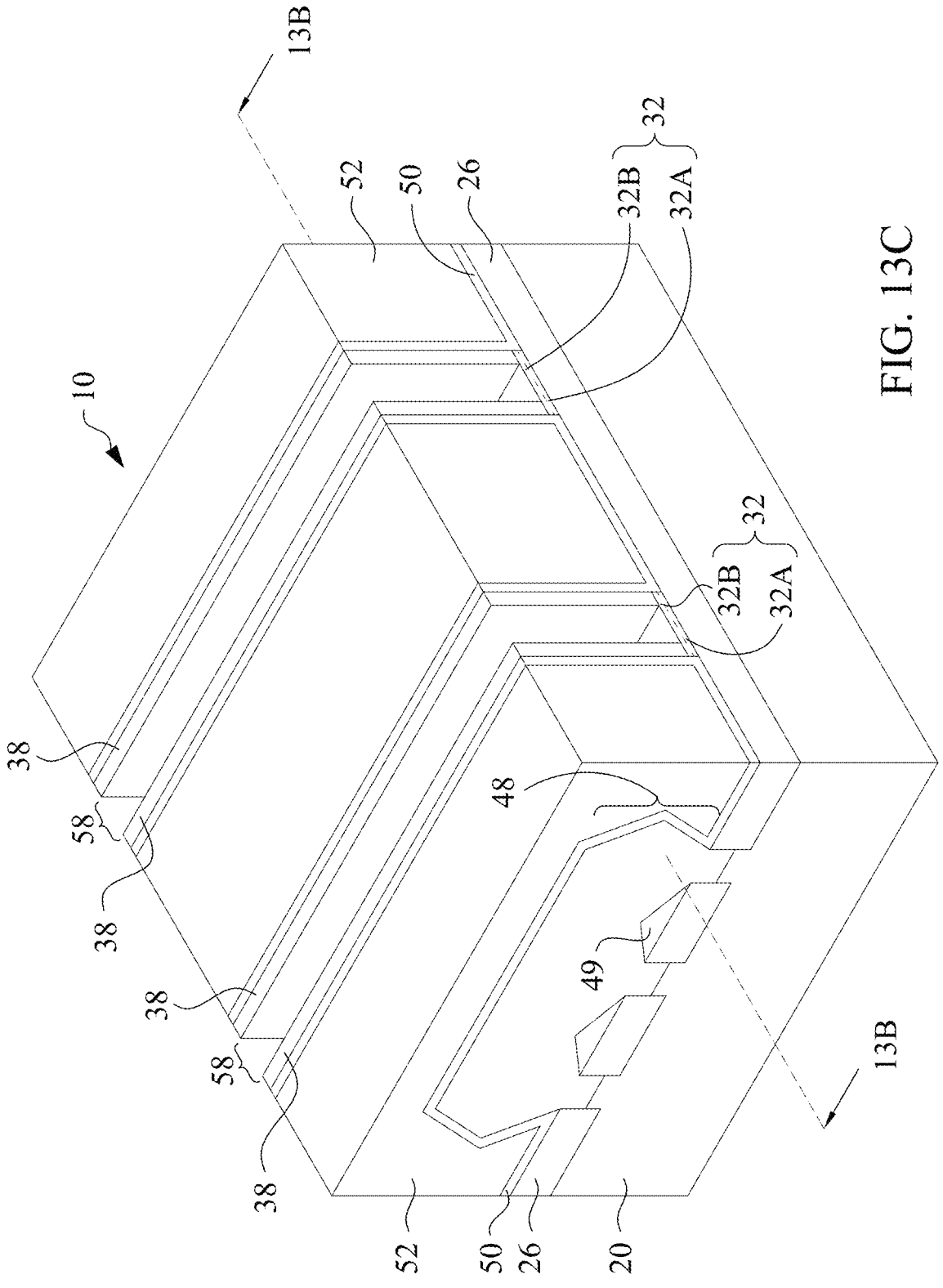

Next, in the process shown in FIGS. 13A, 13B, and 13C, dummy gate electrodes 34 (and hard masks 36, if remaining) are removed in one or more etching processes, so that recesses 58 are formed, as shown in FIGS. 13A and 13B. FIG. 13B illustrates the cross-section 13B-13B in FIG. 13C. The respective process is illustrated as process 232 in the process flow 200 shown in FIG. 16. The portions of the gate dielectrics 32 in recesses 58 are exposed.

In accordance with some embodiments, the removal of dummy gate electrodes 34 may be performed through a dry and/or wet etching process. For example, when dry etching is performed, the etching gas may include $F_2$, $Cl_2$, HCl, HBr, $Br_2$, $C_2F_6$, $CF_4$, $SO_2$, or the like, or combinations thereof. After the removal of dummy gate electrodes 34, a cleaning process may be performed, which may be performed through a dry etching process using, for example, HF.

Figure 13E:
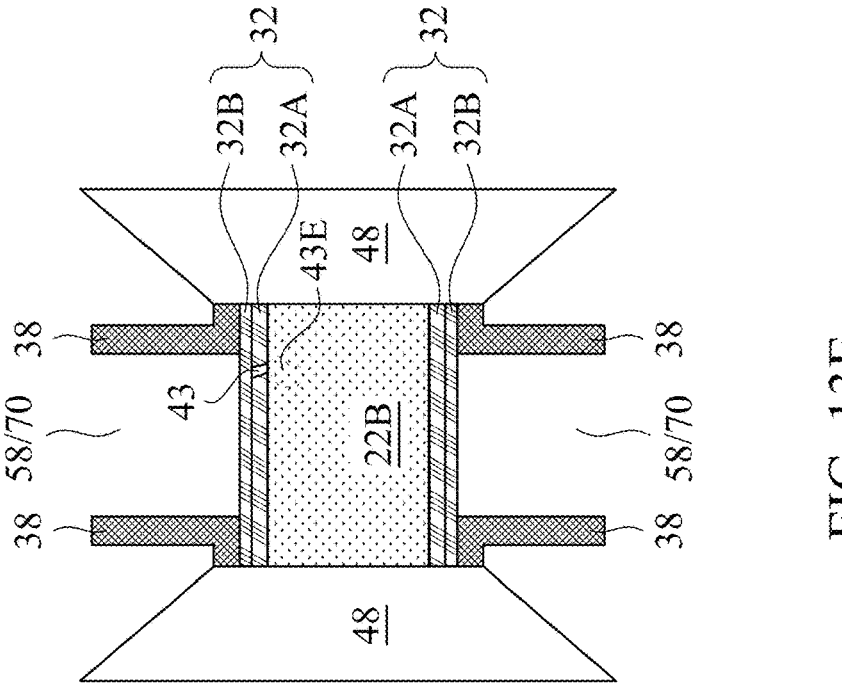
Figure 13D:
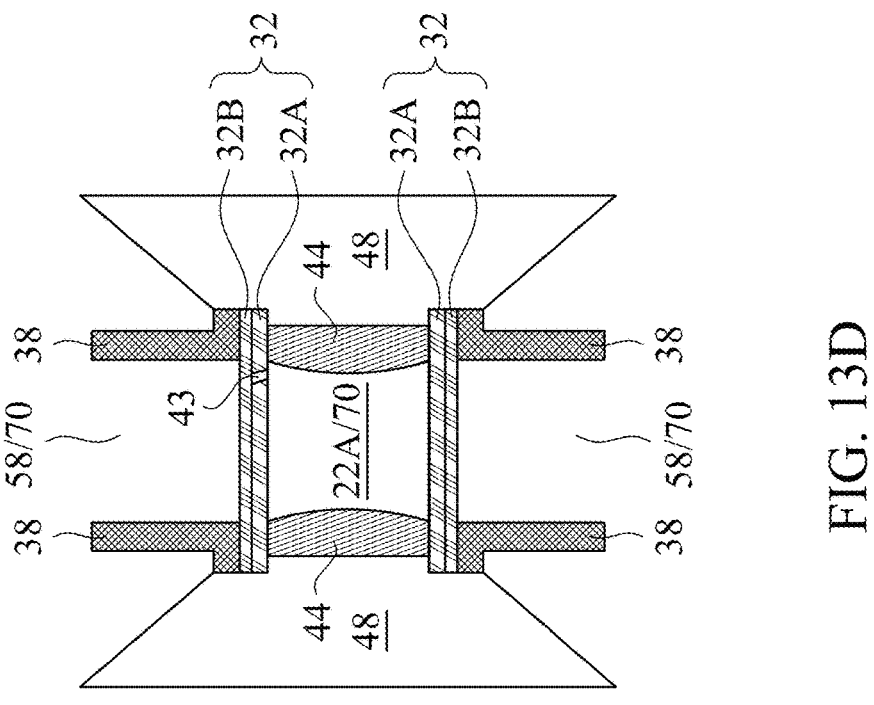

FIGS. 13D and 13E illustrate the top views of the structure shown in FIGS. 13A, 13B, and 13C, with the top views obtained from the same horizontal planes as shown in FIGS. 8C and 8D, respectively. As can be observed from FIG. 13E, if through-channels 43 penetrates through the entire dielectric layer 32, the chemicals for etching dummy gate electrodes 34 and the subsequent cleaning process may pass through openings 58 and through-channels 43 to reach nanostructures 22B, which may be formed of or comprise silicon. Accordingly, nanostructures 22B may be damaged, with voids 43E formed therein. In accordance with the embodiments of the present disclosure, upper sub layer 32B advantageously blocks through-channels 43 from extending into it, and hence through-channels 43 will not be able to penetrate through the entire dielectric layer 32. The chemicals in recesses 58 will not be able to reach and damage nanostructures 22B.

Figure 14B:
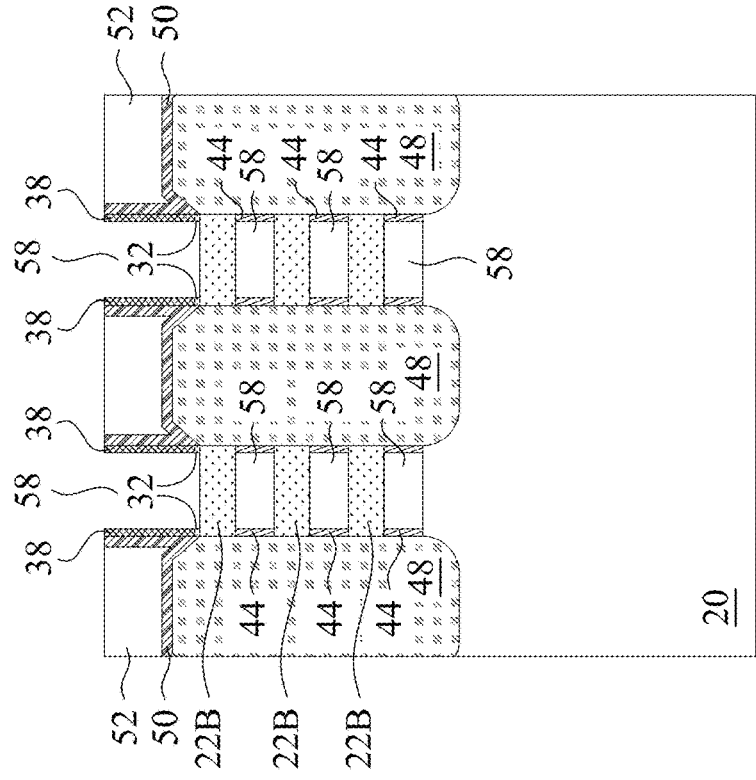
Figure 14A:
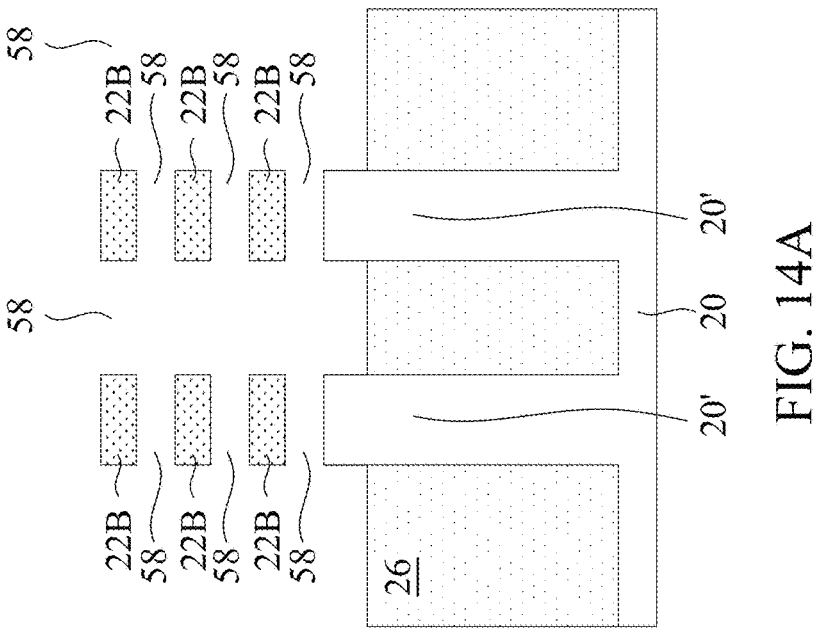

Referring to FIGS. 14A and 14B, the exposed portions of gate dielectrics 32 are etched. The respective process is illustrated as process 234 in the process flow 200 shown in FIG. 16. The portions of gate dielectrics 32 directly underlying gate spacers 38, on the other hand, are protected from being removed.

Sacrificial layers 22A are then removed to extend recesses 58 between nanostructures 22B. The respective process is illustrated as process 236 in the process flow 200 shown in FIG. 16. Sacrificial layers 22A may be removed by performing an isotropic etching process such as a wet etching process using etchants which are selective to the materials of sacrificial layers 22A, while nanostructures 22B, substrate 20, STI regions 26, and the remaining gate dielectrics 32 are relatively un-etched as compared to sacrificial layers 22A. In accordance with some embodiments, sacrificial layers 22A include, for example, SiGe, and nanostructures 22B include, for example, Si or carbon-doped silicon. Chemicals such as tetra methyl ammonium hydroxide (TMAH), ammonium hydroxide ($NH_4OH$), or the like may be used to remove sacrificial layers 22A.

Figure 15B:
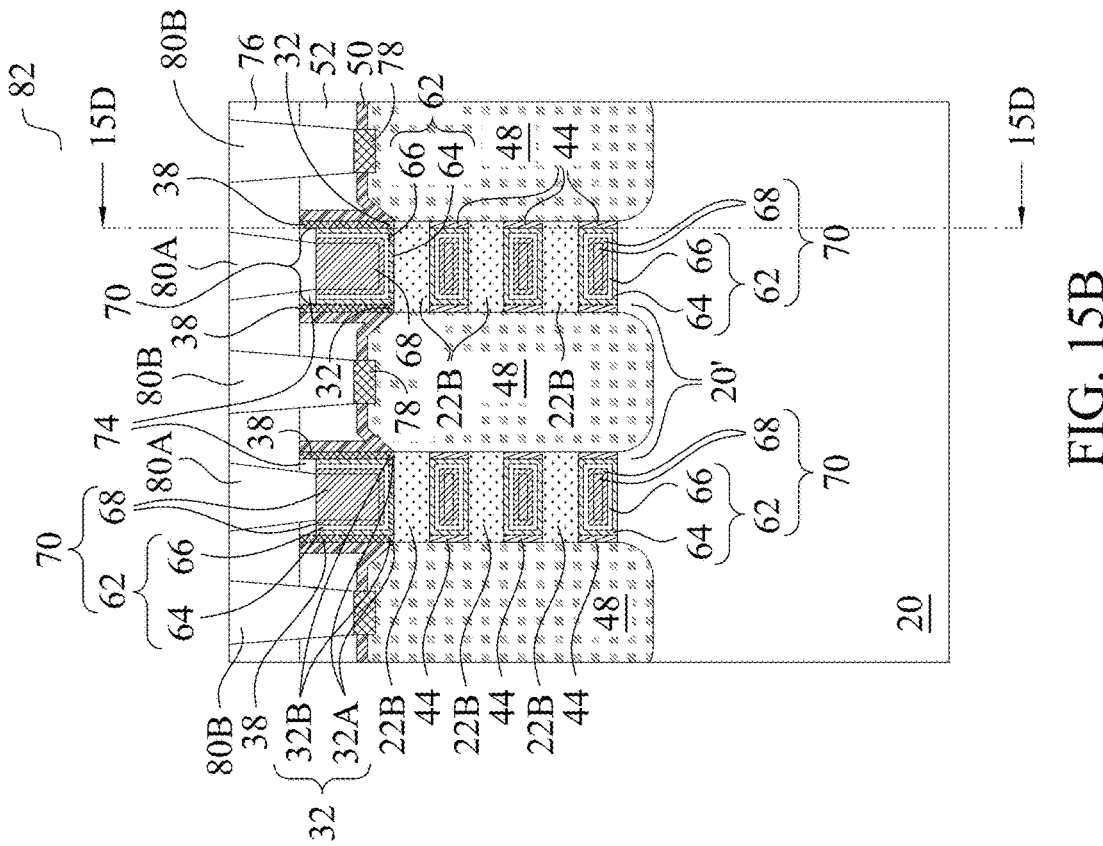
Figure 15A:
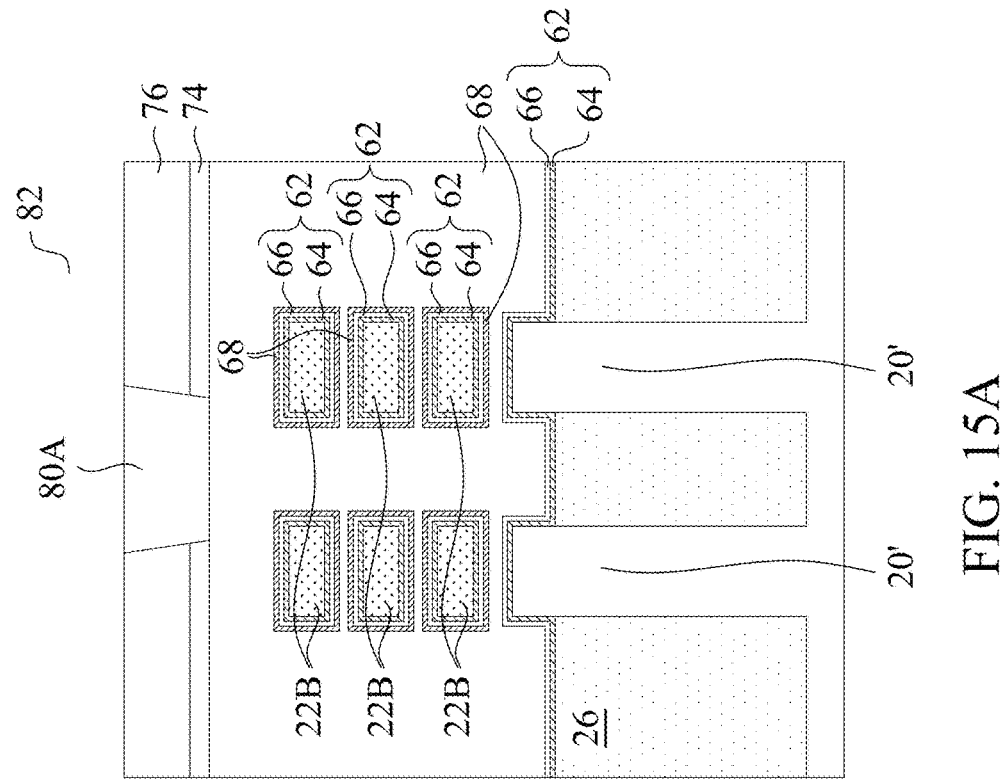
Figure 15C:
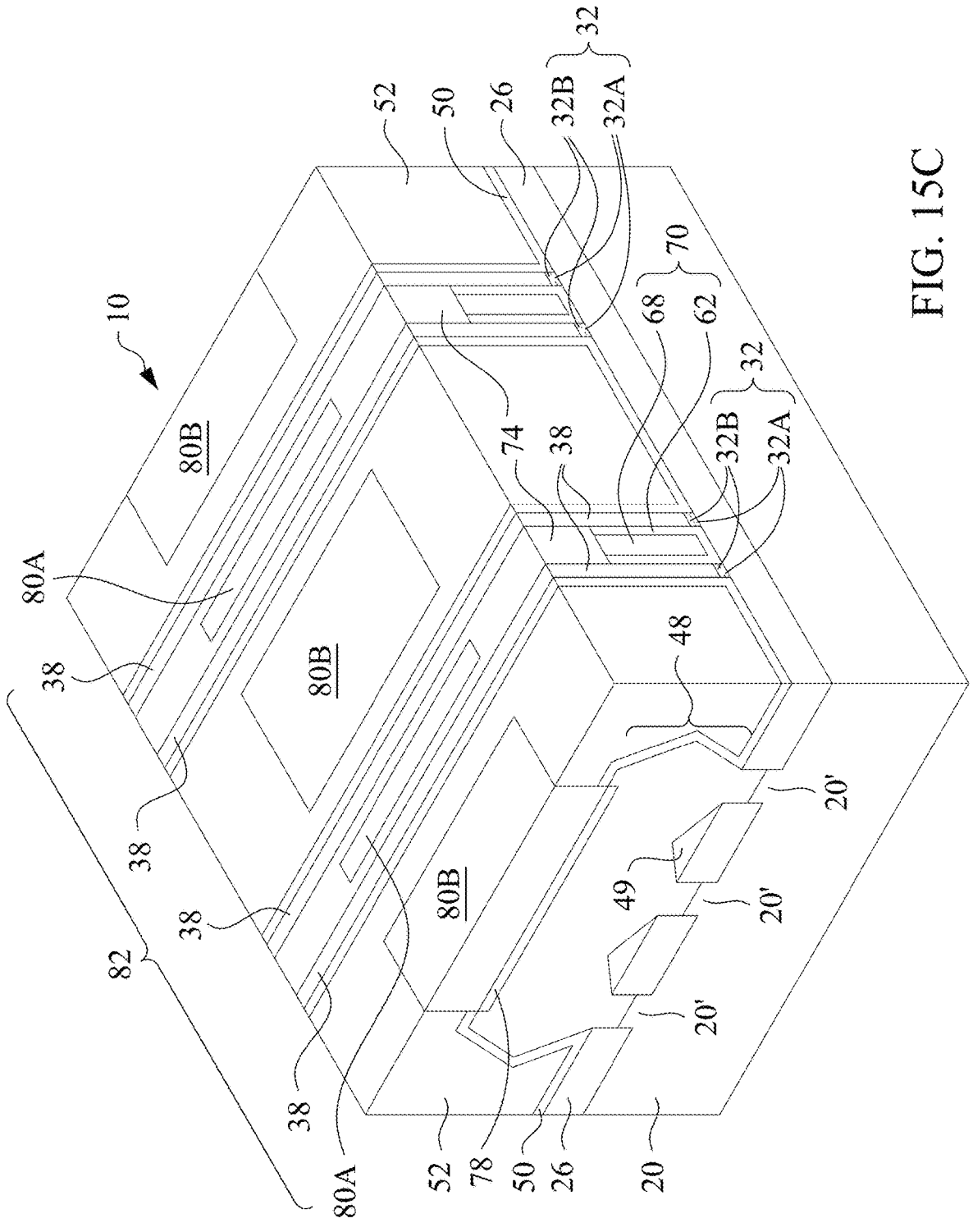

Referring to FIGS. 15A, 15B, and 15C, gate stacks 70 are formed. The respective process is illustrated as process 238 in the process flow 200 shown in FIG. 16. Gate dielectrics 62 are first formed. In accordance with some embodiments, each of gate dielectrics 62 includes an interfacial layer 64 and a high-k dielectric layer 66 on the interfacial layer 64. The interfacial layer 64 may be formed of or comprise silicon oxide, which may be deposited through a conformal deposition process such as ALD or CVD. In accordance with some embodiments, the high-k dielectric layer 66 comprise one or more dielectric layers. For example, high-k dielectric layer 66 may include a metal oxide or a silicate of hafnium, aluminum, zirconium, lanthanum, manganese, barium, titanium, lead, and combinations thereof.

Gate electrodes 68 are formed over gate dielectrics 62. In the formation process, conductive layers are first formed on high-k dielectric layer 66 to fill the remaining portions of recesses 58. Gate electrodes 68 may include a metal-containing material such as TiN, TaN, TiAl, TiAlC, cobalt, ruthenium, aluminum, tungsten, combinations thereof, and/ or multilayers thereof. Gate electrodes 68 may also comprise a filling metal such as cobalt, tungsten, or the like. Gate dielectrics 62 and gate electrodes 68 also fill the spaces between adjacent ones of nanostructures 22B, and fill the spaces between the bottom ones of nanostructures 22B and the underlying substrate strips 20'. After the filling of recesses 58, a planarization process such as a CMP process or a mechanical grinding process is performed to remove the excess portions of gate dielectrics 62 and gate electrodes 68, which excess portions are over the top surface of ILD 52. Gate electrodes 68 and gate dielectrics 62 are collectively referred to as gate stacks 70 of the resulting nano-FETs.

Next, gate stacks 70 are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52.

As further illustrated by FIGS. 15A and 15B, ILD 76 is deposited over ILD 52 and over gate masks 74. An etch stop layer (not shown), may be, or may not be, deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

ILD 76, ILD 52, CESL 50, and gate masks 74 are etched to form recesses (occupied by contact plugs 80A and 80B), through which the epitaxial source/drain regions 48 and/or gate stacks 70 are exposed. The recesses may be formed through an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 15B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 15B and 15C) are formed over the epitaxial source/drain regions 48. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Gate contact plugs 80A and source/drain contact plugs 80B are formed. The respective process is illustrated as process 240 in the process flow 200 shown in FIG. 16. Source/drain contact plugs 80B are formed over silicide regions 78. Gate contacts 80A are over and contacting gate electrodes 68. Contact plugs 80A and 80B may each comprise one or more layers, such as a barrier layer and a filling material. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. GAA transistor 82 is thus formed.

Figure 15D:
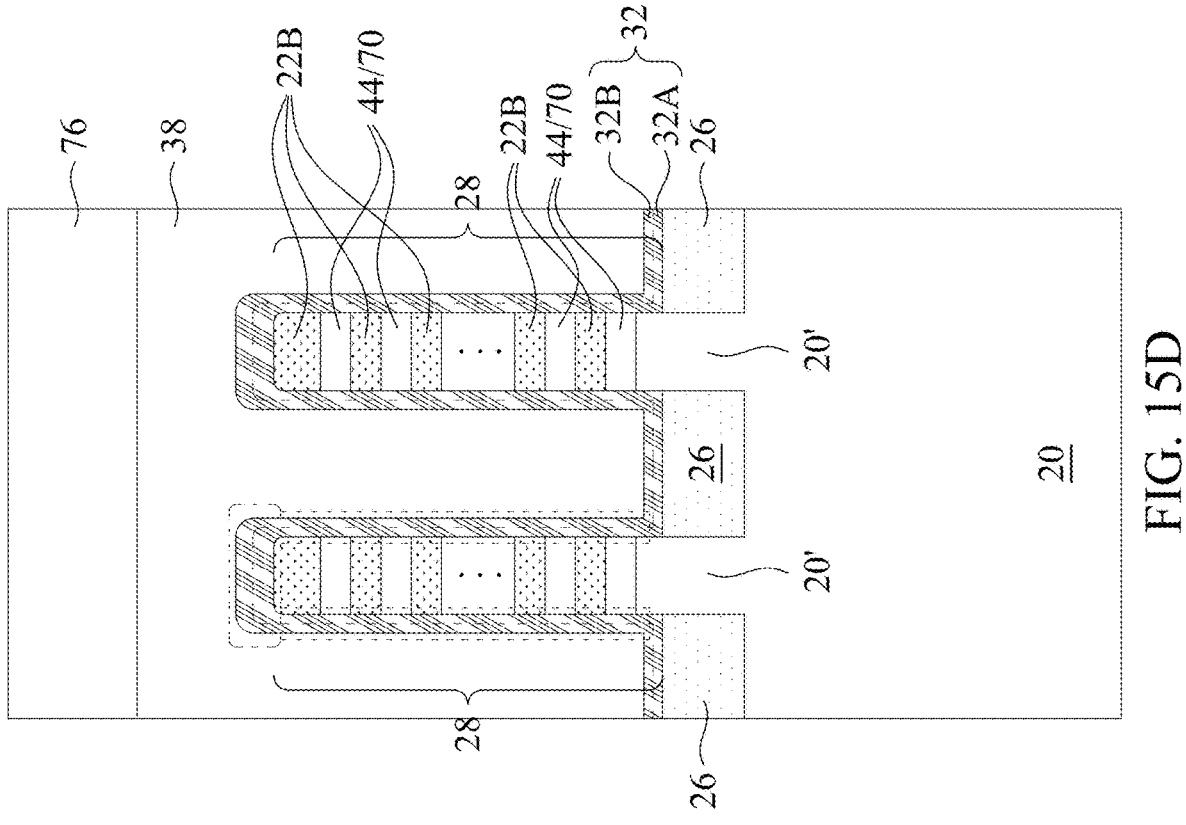

Gate dielectric 32 may exist in the final GAA transistor 82, and may have a single-layer structure or a multi-layer structure. A cross-section 15D-15D (FIG. 15B) is shown in FIG. 15D. in FIG. 15D, the regions marked as 44/70 represent that in the illustrated cross-section, inner spacer 44 and/or gate stacks 70 may appear. The top views of the structure may also be found from FIGS. 13D and 13E, wherein the spaces 58 are filled with the replacement gate stack 70, and sacrificial semiconductor layer 22A is also replaced with replacement gate stack 70. In GAA transistor 82, dielectric layer 32 may be distinguished, for example, through Transmission Electron Microscopy (TEM), Energy Dispersed X-ray (EDX), Electron Energy-Loss Spectroscopy (EELS), and/or the like.

The embodiments of the present disclosure have some advantageous features. By forming multi-layer dummy gate dielectrics, the damage to nanostructures is avoided. Also, by forming non-conformal dummy gate dielectric layers, the loss of top nanostructures is avoided or reduced. Experiments have revealed that by forming non-conformal dummy gate dielectric layers, the loss of top nanostructures may be reduced to 30 percent of the lost when conformal dummy gate dielectric layers are used.

In accordance with some embodiments, a method comprises forming a protruding semiconductor stack comprising a plurality of sacrificial layers; and a plurality of nanostructures, wherein the plurality of sacrificial layers and the plurality of nanostructures are laid out alternatingly; depositing a dielectric layer on a sidewall and a top surface of the protruding semiconductor stack, wherein the dielectric layer comprises a lower sub layer; and an upper sub layer over the lower sub layer, wherein the lower sub layer and the upper sub layer comprise different dielectric materials; forming a dummy gate electrode layer on the dielectric layer; patterning the dummy gate electrode layer to form a dummy gate electrode, wherein the dielectric layer is used as an etch stop layer; forming a gate spacer on an additional sidewall of the dummy gate electrode; removing the dummy gate electrode; etching the dielectric layer to reveal the protruding semiconductor stack; removing the plurality of sacrificial layers; and forming a replacement gate stack filling spaces left by the removed dummy gate electrode and the removed plurality of sacrificial layers.

In an embodiment, a first one of the lower sub layer and the upper sub layer is formed as a non-conformal layer. In an embodiment, the first one of the lower sub layer and the upper sub layer that is non-conformal is formed using atomic layer deposition. In an embodiment, a second one of the lower sub layer and the upper sub layer is also formed using atomic layer deposition, and the second one of the lower sub layer and the upper sub layer is a conformal layer. In an embodiment, both of the lower sub layer and the upper sub layer have top thicknesses equal to sidewall thicknesses.

In an embodiment, the method further comprises, after the gate spacer is formed, etching portions of the protruding semiconductor stack, wherein a portion of the protruding semiconductor stack underlying the gate spacer and the dummy gate electrode remains after the etching; and laterally recessing the plurality of sacrificial layers, wherein a through-hole is formed to penetrate through the lower sub layer, and wherein the through-hole is blocked by the upper sub layer. In an embodiment, at a time after the dummy gate electrode is removed, the upper sub layer is exposed, and wherein the upper sub layer blocks chemicals used in the removing the dummy gate electrode to extend into the through-hole.

In an embodiment, after the etching the dielectric layer to reveal the protruding semiconductor stack, a part of the dielectric layer directly underlying the gate spacer remains. In an embodiment, the lower sub layer comprises silicon oxide, and the upper sub layer comprises silicon and carbon. In an embodiment, the lower sub layer comprises silicon oxide, and the upper sub layer comprises silicon and nitrogen.

In accordance with some embodiments, a device comprises a gate stack comprising a top portion; a stacked structure underlying the top portion of the gate stack, the stacked structure comprising a plurality of semiconductor nanostructures, with upper nanostructures in the plurality of semiconductor nanostructures overlapping lower nanostructures in the plurality of semiconductor nanostructures; and a plurality of gate structures, each comprising a lower portion of the gate stack, wherein each of the plurality of gate structures is between two of the plurality of semiconductor nanostructures; a dielectric layer extending on a top surface and a sidewall of the stacked structure, wherein the dielectric layer comprises a lower sub layer comprising a first dielectric material; and an upper sub layer over the lower sub layer, wherein the upper sub layer comprises a second dielectric material different from the first dielectric material; a gate spacer on the dielectric layer; and a source/drain region aside of the gate stack.

In an embodiment, a first layer among the lower sub layer and the upper sub layer is a non-conformal layer, with a top part of the first layer over the top surface of the stacked structure having a first thickness, and a lower part of the first layer on the sidewall of the stacked structure having a second thickness smaller than the first thickness. In an embodiment, a ratio of the first thickness to the second thickness is in a range between about 2 and about 5.

In an embodiment, a second layer among the lower sub layer and the upper sub layer is a conformal layer. In an embodiment, the lower sub layer has an air gap therein, and wherein the upper sub layer and one of the plurality of semiconductor nanostructures are on opposite sides of the air gap. In an embodiment, the lower sub layer comprises silicon oxide, and the upper sub layer comprises silicon carbide. In an embodiment, the stacked structure further comprises dielectric inner spacers, each between two of the plurality of semiconductor nanostructures, wherein the lower sub layer is in contact with the dielectric inner spacers.

In accordance with some embodiments, a device comprises a semiconductor substrate; a first dielectric isolation region and a second dielectric isolation region comprising at least some parts in the semiconductor substrate; a protruding structure protruding higher than top surfaces of the first dielectric isolation region and the second dielectric isolation region, wherein the protruding structure is laterally between the first dielectric isolation region and the second dielectric isolation region, and wherein the protruding structure comprises a plurality of semiconductor layers; and a plurality of gate stack portions, wherein the plurality of semiconductor layers and the plurality of gate stack portions are located alternatingly; a plurality of inner spacers comprising a plurality of pairs, with each pair being on opposite sides of one of the plurality of gate stack portions; and a dielectric layer comprising a top portion over the protruding structure, wherein the top portion has a first thickness; and a sidewall portion contacting one of the plurality of inner spacers, wherein the sidewall portion has a second thickness different from the first thickness. In an embodiment, the dielectric layer comprises a plurality of sub layers formed of different materials. In an embodiment, the first thickness is greater than the second thickness, with a ratio of the first thickness to the second thickness being in a range between about 2 and about 5.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a protruding semiconductor stack comprising:
a plurality of sacrificial layers; and
a plurality of nanostructures, wherein the plurality of sacrificial layers and the plurality of nanostructures are laid out alternatingly;
depositing a dielectric layer on a sidewall and a top surface of the protruding semiconductor stack, wherein the dielectric layer comprises:
a lower sub layer; and
an upper sub layer over the lower sub layer, wherein the lower sub layer and the upper sub layer comprise different dielectric materials;
forming a dummy gate electrode layer on the dielectric layer;
patterning the dummy gate electrode layer to form a dummy gate electrode, wherein the dielectric layer is used as an etch stop layer;
forming a gate spacer on an additional sidewall of the dummy gate electrode;
after the gate spacer is formed, etching portions of the protruding semiconductor stack, wherein a portion of the protruding semiconductor stack underlying the gate spacer and the dummy gate electrode remains after the etching;
laterally recessing the plurality of sacrificial layers, wherein a through-hole is formed to penetrate through the lower sub layer, and wherein the through-hole is blocked by the upper sub layer;
removing the dummy gate electrode;
etching the dielectric layer to reveal the protruding semiconductor stack;
removing the plurality of sacrificial layers; and
forming a replacement gate stack filling spaces left by the removed dummy gate electrode and the removed plurality of sacrificial layers.

2. The method of claim 1, wherein a first one of the lower sub layer and the upper sub layer is formed as a non-conformal layer.

3. The method of claim 2, wherein the first one of the lower sub layer and the upper sub layer that is non-conformal is formed using atomic layer deposition.

4. The method of claim 3, wherein a second one of the lower sub layer and the upper sub layer is also formed using atomic layer deposition, and the second one of the lower sub layer and the upper sub layer is a conformal layer.

5. The method of claim 2, wherein the dielectric layer is deposited through a CVD-mode Atomic layer deposition process to achieve a greater top thickness than sidewall thicknesses.

6. The method of claim 1, wherein both of the lower sub layer and the upper sub layer have top thicknesses equal to sidewall thicknesses.

7. The method of claim 1, wherein at a time after the dummy gate electrode is removed, the upper sub layer is exposed, and wherein the upper sub layer blocks chemicals used in the removing the dummy gate electrode to extend into the through-hole.

8. The method of claim 1, wherein after the etching the dielectric layer to reveal the protruding semiconductor stack, a part of the dielectric layer directly underlying the gate spacer remains.

9. The method of claim 1, wherein the lower sub layer comprises silicon oxide, and the upper sub layer comprises silicon and carbon.

10. The method of claim 1, wherein the lower sub layer comprises silicon oxide, and the upper sub layer comprises silicon and nitrogen.

11. A device comprising:
 a gate stack comprising a top portion;
 a stacked structure underlying the top portion of the gate stack, the stacked structure comprising:
  a plurality of semiconductor nanostructures, with upper nanostructures in the plurality of semiconductor nanostructures overlapping lower nanostructures in the plurality of semiconductor nanostructures; and
  a plurality of gate structures, each comprising a lower portion of the gate stack, wherein each of the plurality of gate structures is between two of the plurality of semiconductor nanostructures;
 a dielectric layer extending on a top surface and a sidewall of the stacked structure, wherein the dielectric layer comprises:
  a lower sub layer comprising a first dielectric material; and
  an upper sub layer over the lower sub layer, wherein the upper sub layer comprises a second dielectric material different from the first dielectric material;
 a gate spacer on the dielectric layer; and
 a source/drain region aside of the gate stack.

12. The device of claim 11, wherein a first layer among the lower sub layer and the upper sub layer is a non-conformal layer, with a top part of the first layer over the top surface of the stacked structure having a first thickness, and a lower part of the first layer on the sidewall of the stacked structure having a second thickness different from the first thickness.

13. The device of claim 12, wherein the first thickness is greater than the second thickness, with a ratio of the first thickness to the second thickness being in a range between about 2 and about 5.

14. The device of claim 12, wherein a second layer among the lower sub layer and the upper sub layer is a conformal layer.

15. The device of claim 11, wherein the lower sub layer has an air gap therein, and wherein the upper sub layer and one of the plurality of semiconductor nanostructures are on opposite sides of the air gap.

16. The device of claim 11, wherein the lower sub layer comprises silicon oxide, and the upper sub layer comprises silicon carbide.

17. The device of claim 11, wherein the stacked structure further comprises dielectric inner spacers, each between two of the plurality of semiconductor nanostructures, wherein the lower sub layer is in contact with the dielectric inner spacers.

18. A device comprising:
 a semiconductor substrate;
 a first dielectric isolation region and a second dielectric isolation region comprising at least some parts in the semiconductor substrate;
 a protruding structure protruding higher than top surfaces of the first dielectric isolation region and the second dielectric isolation region, wherein the protruding structure is laterally between the first dielectric isolation region and the second dielectric isolation region, and wherein the protruding structure comprises:
  a plurality of semiconductor layers; and
  a plurality of gate stack portions, wherein the plurality of semiconductor layers and the plurality of gate stack portions are located alternatingly;
  a plurality of inner spacers comprising a plurality of pairs, with each pair being on opposite sides of one of the plurality of gate stack portions; and
 a dielectric layer comprising:
  a top portion over the protruding structure, wherein the top portion has a first thickness; and
  a sidewall portion contacting one of the plurality of inner spacers, wherein the sidewall portion has a second thickness different from the first thickness.

19. The device of claim 18, wherein the dielectric layer comprises a plurality of sub layers formed of different materials.

20. The device of claim 18, wherein the first thickness is greater than the second thickness, with a ratio of the first thickness to the second thickness being in a range between about 2 and about 5.

\* \* \* \* \*